United States Patent
Zhao et al.

(10) Patent No.: US 12,412,731 B2
(45) Date of Patent: Sep. 9, 2025

(54) COIL STRUCTURE AND PLASMA PROCESSING APPARATUS

(71) Applicant: BEIJING NAURA MICROELECTRONICS EQUIPMENT CO., LTD., Beijing (CN)

(72) Inventors: Jinrong Zhao, Beijing (CN); Ying Zhang, Beijing (CN); Xing Chen, Beijing (CN); Gang Wei, Beijing (CN); Chen Niu, Beijing (CN); Jinji Xu, Beijing (CN); Song Wang, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 215 days.

(21) Appl. No.: 18/003,086

(22) PCT Filed: May 28, 2021

(86) PCT No.: PCT/CN2021/096658
§ 371 (c)(1),
(2) Date: Dec. 22, 2022

(87) PCT Pub. No.: WO2021/258990
PCT Pub. Date: Dec. 30, 2021

(65) Prior Publication Data
US 2023/0260751 A1    Aug. 17, 2023

(30) Foreign Application Priority Data
Jun. 23, 2020    (CN) .................. 202010578805.X

(51) Int. Cl.
*H01J 37/32*     (2006.01)
*H01F 5/04*     (2006.01)

(52) U.S. Cl.
CPC ............ *H01J 37/3211* (2013.01); *H01F 5/04* (2013.01); *H01J 2237/3343* (2013.01)

(58) Field of Classification Search
CPC .............. H01J 37/321; H01J 37/3211; H01J 37/32119; H01J 37/32137; H01J 37/3222;
(Continued)

(56) References Cited

U.S. PATENT DOCUMENTS 5,716,451 A * 2/1998 Hama ................ H01J 37/321
                                                            118/723 I
5,975,013 A    11/1999 Holland et al.
(Continued)

FOREIGN PATENT DOCUMENTS

CN    101960928 A    1/2011
CN    110416054 A    11/2019
(Continued)

OTHER PUBLICATIONS

The World Intellectual Property Organization (WIPO) International Search Report for PCT/CN2021/096658 Aug. 27, 2021 6 Pages (including translation).

*Primary Examiner* — Gordon Baldwin
*Assistant Examiner* — Joshua Reyes
(74) *Attorney, Agent, or Firm* — ANOVA LAW GROUP, PLLC

(57) ABSTRACT

A coil structure includes a coil set including a first coil and a second coil. The first coil and the second coil are wound to form an annular area. A first end of the first coil and a first end of the second coil are close to an inner ring of the annular area. A second end of the first coil and a second end of the second coil are close to an outer ring of the annular
(Continued)

area. The first end of the first coil is electrically connected to the first end of the second coil. A first projection-of the first coil on a plane perpendicular to an axial direction of the coil structure and a second projection of the second coil on the plane are mirror-symmetrical to each other.

19 Claims, 32 Drawing Sheets

(58) Field of Classification Search
CPC ...... H01J 2237/3343; H01F 5/00; H01F 5/04; C23C 16/0245; C23C 16/505; H01L 21/67063
See application file for complete search history.

(56) References Cited

U.S. PATENT DOCUMENTS

| | | | | |
|---|---|---|---|---|
| 6,076,482 | A * | 6/2000 | Ding | H01J 37/32458 |
| | | | | 438/758 |
| 6,534,922 | B2 * | 3/2003 | Bhardwaj | H01J 37/321 |
| | | | | 315/111.21 |
| 2001/0022158 | A1 * | 9/2001 | Brcka | H01J 37/321 |
| | | | | 156/345.48 |
| 2003/0067273 | A1 | 4/2003 | Benjamin et al. | |
| 2008/0223521 | A1 * | 9/2008 | Kim | H01J 37/321 |
| | | | | 156/345.1 |
| 2010/0066251 | A1 * | 3/2010 | Nakagami | H01J 37/32174 |
| | | | | 315/111.51 |
| 2017/0186585 | A1 * | 6/2017 | Zuo | H01J 37/3211 |

FOREIGN PATENT DOCUMENTS

| | | | |
|---|---|---|---|
| CN | 110534393 A | 12/2019 | |
| CN | 111785605 A | 10/2020 | |
| EP | 0813227 A2 | 12/1997 | |
| KR | 20120140084 A | 12/2012 | |
| KR | 20150122063 A | 10/2015 | |
| TW | 200833180 A | 8/2008 | |
| TW | 201405627 A | 2/2014 | |
| TW | 201833975 A | 9/2018 | |
| WO | 2007062605 A1 | 6/2007 | |
| WO | WO-2011065506 A1 * | 6/2011 | ......... C23C 16/4401 |
| WO | 2011133562 A2 | 10/2011 | |
| WO | 2016201612 A1 | 12/2016 | |

* cited by examiner

COIL STRUCTURE AND PLASMA PROCESSING APPARATUS

CROSS-REFERENCES TO RELATED APPLICATION APPLICATIONS

This application is a national phase entry under 35 U.S.C. § 371 of International Application No. PCT/CN2021/096658, filed on May 28, 2021, which claims priority to Chinse patent application No. 202010578805.X, titled "Coil Structure and Plasma Processing Apparatus," filed on Jun. 23, 2020 with China National Intellectual Property Administration, the entire contents of both of which is incorporated herein by reference.

TECHNICAL FIELD

The present disclosure generally relates to the semiconductor technology field and, more particularly, to a coil structure and a plasma processing apparatus.

BACKGROUND

With the development of integrated circuit manufacturing technology, requirements for uniformity of an etching environment are getting higher and higher. In an etching process, an upper electrode is usually configured to excite and generate plasma, and uniformity of plasma distribution determines etching uniformity. Thus, an upper electrode structure configured to generate the plasma, such as a coil structure, is very important for the uniformity of the etching process.

In the existing technology, coils as shown in FIG. 1 and FIG. 2 are generally used. In FIG. 1, a coil structure includes an inner coil set and an outer coil set that are connected in parallel. The inner coil set and the outer coil set are in a planar structure. The inner coil set and the outer coil set each include two coils that are connected in parallel. A single coil is wound in involute or concentric circles. As shown in FIG. 2, the single coil is wound in an involute with 1.5 turns. As shown in FIG. 2, geometric distribution of coil winding is uneven, which causes left and right distribution of an electromagnetic field to be asymmetrical. Thus, the coil structure has different currents on the left and right. During a processing process, density distribution of free radicals and ions is caused to be asymmetrical. That is, the plasma distribution is caused to be asymmetrical. Thus, wafer etching is caused to be asymmetrical, which has negative effects on etching quality or efficiency.

SUMMARY

The problem solved by the present disclosure includes that the etching quality or the etching efficiency is negatively impacted due to an uneven plasma generated by asymmetrically distributed electromagnetic field of the coil structure in left and right in the existing technology.

To solve the above problem, the present disclosure provides a coil structure applied to the plasma processing apparatus. The coil structure includes at least one coil set.

The coil set includes a first coil and a second coil. The first coil and the second coil are wound to form an annular area. A first end of the first coil and a first end of the second coil are close to an inner ring of the annular area, and a second end of the first coil and a second end of the second coil are close to an outer ring of the annular area.

The first end of the first coil is electrically connected to the first end of the second coil.

The first coil forms a first projection on a plane perpendicular to an axial direction of the coil structure. The second coil forms a second projection on a plane parallel to the axial direction of the coil structure. The first projection and the second projection are mirror-symmetrical to each other.

In come embodiments, along the axial direction of the coil structure, the first end of the first coil and the first end of the second coil are arranged at an interval in an up-down direction, and the second end of the first coil and the second end of the second coil are arranged at an interval in the up-down direction. A connection line between the first end of the first coil and the first end of the second coil is parallel to an axis of the coil structure. A connection line between the second end of the first coil and the second end of the second coil is parallel to the axis of the coil structure.

In some embodiments, the coil structure includes at least two coil sets, and first ends of first coils of the at least two coil sets are on a first plane. First ends of second coils of the at least two coil sets are on a second plane. Second ends of first coils of the at least two coil sets are on a third plane. Second ends of second coils of the at least two coil sets are on a fourth plane. A predetermined distance exists between the first plane and the second plane and between the third plane and the fourth plane.

In some embodiments, the predetermined distance is 10 mm.

In some embodiments, the first ends of the first coils of the at least two coil sets are arranged uniformly along a circumferential direction of the coil structure. The second ends of the first coils of the at least two coil sets are arranged uniformly along the circumferential direction of the coil structure.

In some embodiments, winding trajectories of the first coil and the second coil are both in an involute shape.

In some embodiments, a radial radius change amount of each turn of the first coil and/or the second coil is a=60 mm.

In some embodiments, a number of winding turns of the first coil and a number of winding turns of the second coil are both integer multiples of 0.5 turns.

In some embodiments, the coil structure includes an even number of coil sets.

In the coil structure of the present disclosure, the plane perpendicular to a radial direction of the coil structure is taken as the projection plane. A single coil set is taken as an example. The coil set may be formed by winding the first coil and the second coil, which are electrically connected to each other. The first projection of the first coil and the second projection of the second coil may be mirror-symmetrical to each other on the projection plane. Thus, the magnetic field and the electric field of the coil structure including at least one coil set are mirror-symmetrical. For example, the magnetic field and the electric field may be symmetrically distributed left and right. That is, a left magnetic field is same as a right magnetic field. Left and right electric fields are reversed to each other and cancel each other out. Thus, the uniform plasma is generated to effectively improve the etching quality and etching efficiency of the semiconductor process.

Moreover, the present disclosure further provides a plasma processing apparatus. The plasma processing apparatus includes the RF source, the reaction chamber, the dielectric member arranged on top of the reaction chamber, and the above coil structure. The coil structure is arranged on the dielectric member. The RF source is configured to provide RF power to the coil structure.

In some embodiments, the plasma processing apparatus further includes a connection structure. The connection structure includes a first connector and a second connector.

The second end of the first coil of each coil set is electrically connected to the first connector. The second end of the first coil of each coil set is electrically connected to the second connector; and One of the first connector and the second connector is configured to input RF power. The other one is configured to be grounded.

In some embodiments, the first connector and the second connector are both in an annular structure. The first connector and the second connector are arranged at an interval along the axial direction of the coil structure.

In some embodiments, the connection structure further includes a third connector and a fourth connector.

The third connector is electrically connected to the first connector through a first connection bar. The fourth connector is electrically connected to the second connector through a second connection bar.

One of the third connector and the fourth connector is configured to input RF power, and the other one is configured to be grounded.

In some embodiments, the third connector and the fourth connector both have an annular structure and are arranged at an interval along the axial direction of the coil structure.

In some embodiments, a plurality of first connection bars and a plurality of second connection bars are provided. The plurality of first connection bars and the plurality of second connection bars are uniformly arranged along the circumferential direction of the coil structure.

In some embodiments, the second end of the first coil of each coil set is used as an input end. The second end of the second coil of each coil set is used as an output end. The first connector includes a first connection segment. The first connection segment is connected to the input end. Each first connection segment is connected to the input end with a number of at least one.

And/or the second connector includes a second connection segment. The second connection segment is connected to the output end. Each second connection segment is connected to the output end with a number of at least one.

In some embodiments, the coil structure includes a plurality of coil sets, the first connector includes at least two first connection segments. The at least two first connection segments are arranged at an interval along the circumferential direction to enclose to from a first contour. A number of coil sets is twice a number of first connection segments. A number of input ends connected to each first connection segment is two. The second connector includes at least two second connection segments. At least two second connection segments are arranged at an interval along the circumferential direction to enclose to form a second contour. A number of coil sets is twice a number of second connection segments. A number of output ends connected to each second connection segment is two.

In some embodiments, the first contour is annular, the second contour is annular. The first contour and the second contour are coaxial.

In some embodiments, an interval between any two neighboring first connection segments of the at least two first connection segments is same; and/or an interval between any two neighboring second connection segments of the at least two second connection segments is same.

In some embodiments, the connection structure further includes at least two first connection bars. A number of the first connection bars is same as the number of first connection segments. The first end of the first connection bar is connected to a corresponding first connection segment. The second end of the first connection bar is configured to input RF power.

And/or the connection structure further includes at least two second connection bars. A number of the second connection bars is same as the number of second connection segments. The first end of the second connection bar is connected to a corresponding second connection segment. The second end of the second connection bar is configured to be grounded. In some embodiments, second ends of the at least two first connection bars are connected to a first point, and the first point is used as a power input end configured to input RF power; and/or second ends of the at least two second connection bars are connected to a second point, and the second point is used as a ground end configured to be grounded.

In some embodiments, two ends of the first connection segment are electrically connected to the input ends, respectively. A connection position of the first connection bar and the first connection segment is located at a middle position of the first connection segment along a length direction.

And/or two ends of the second connection segment are electrically connected to the output ends, respectively. A connection position of the second connection bar and the second connection segment is located at a middle position of the second connection segment along the length direction.

In some embodiments, at least two coil structures are provided. The at least two coil structures are sleeved at an interval in a radial direction, or the at least two coil structures are arranged at the interval along the axial direction, and along the axial direction, radial dimensions of the at least two coil structures gradually increase or decrease.

In the coil structure applied to the plasma processing apparatus of embodiments of the present disclosure, the plane perpendicular to the axial direction of the coil structure is used as a projection plane and take a single coil set as an example, the coil set is formed by winding the first coil and the second coil that are electrically connected with each other. The first projection of the first coil and the second projection of the second coil may be mirror-symmetrical to each other on the same projection. The magnetic field and electric field distribution formed by the coil structure including the coil set are mirror-symmetrical, for example, the magnetic field and the electric field are left and right symmetrically distributed. That is, the left and right magnetic fields are the same, and the left and right electric fields cancel each other in opposite directions. Thus, uniformly distributed plasma is generated to effectively improve the etching quality and etching efficiency of the semiconductor process.

BRIEF DESCRIPTION OF THE DRAWINGS

In order to describe the technical solution of embodiments of the present disclosure or in the background technology more clearly, the following briefly introduces the accompanying drawings that are used in the description of embodiments or the background technology. Obviously, the drawings described below are merely some embodiments of the present disclosure. For those of ordinary skill in the art, other drawings can also be obtained according to these drawings without any creative effort.

Figure 1:
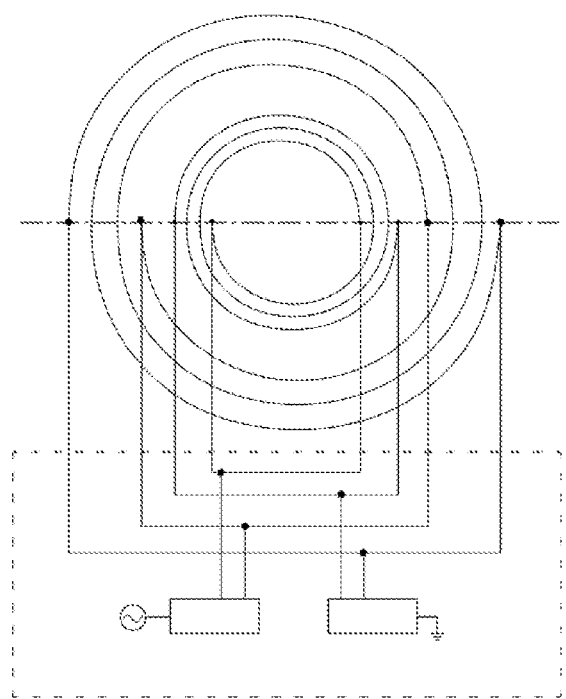
FIG. 1 is a schematic structural diagram of a coil in the existing technology.
Figure 2:
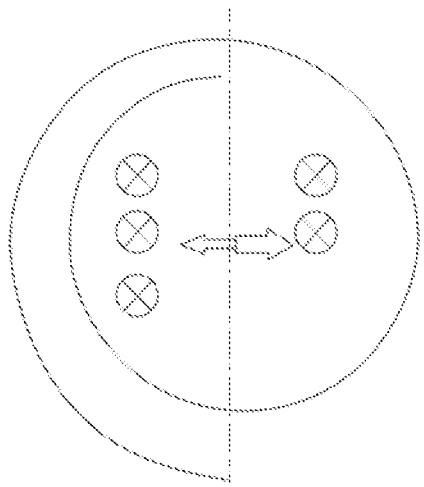
FIG. 2 is a schematic distribution diagram of a magnetic field of a single coil in a coil structure in the existing technology.

| Reference numerals: | | | |
|---|---|---|---|
| 10 Coil structure; | 100 Coil set; | 110 First coil; | 120 Second coil; |
| 130 Vertical connection bar; | | 140 External coil set; | 150 Internal coil set; |
| 111 First end of first coil; | | 112 Second end of first coil; | |
| 121 First end of second coil; | | 122 Second end of second coil; | |
| 200 Connection structure; | | 210 First connector; | 220 Second connector; |
| 230 Third connector; | | 240 Fourth connector; | |
| 250 First connection bar; | | 260 Second connection bar; | |

| Reference numerals: | |
|---|---|
| 270 Power input end; | 280 Ground end; |
| 201 External connection structure; | 202 Internal connection structure; |
| 211 First wire connector; | 212 First connection segment; |
| 213 First contour; | 221 Second wire connector; |
| 222 Second connection segment; | 223 Second contour; |
| 300 Reaction chamber; | 310 Inner liner; |
| 320 Support base; | 330 Chamber edge; |
| 340 Continuous magnetic field; | 400 Dielectric member; |
| 500 Shield cover; | 600 Matcher; |
| 700 Radio frequency source; | 910 Outer ring assembly; |
| 920 Inner ring assembly; | 930 Inner ring magnetic field; |
| 940 Outer ring magnetic field. | |

DETAILED DESCRIPTION OF THE EMBODIMENTS

In order to make the above objects, features, and advantages of the present disclosure more clearly understood, specific embodiments of the present disclosure are described in detail below with reference to the accompanying drawings. It should be understood that the specific embodiments described herein are only used to explain the present disclosure, but not to limit the present disclosure.

Figure 19:
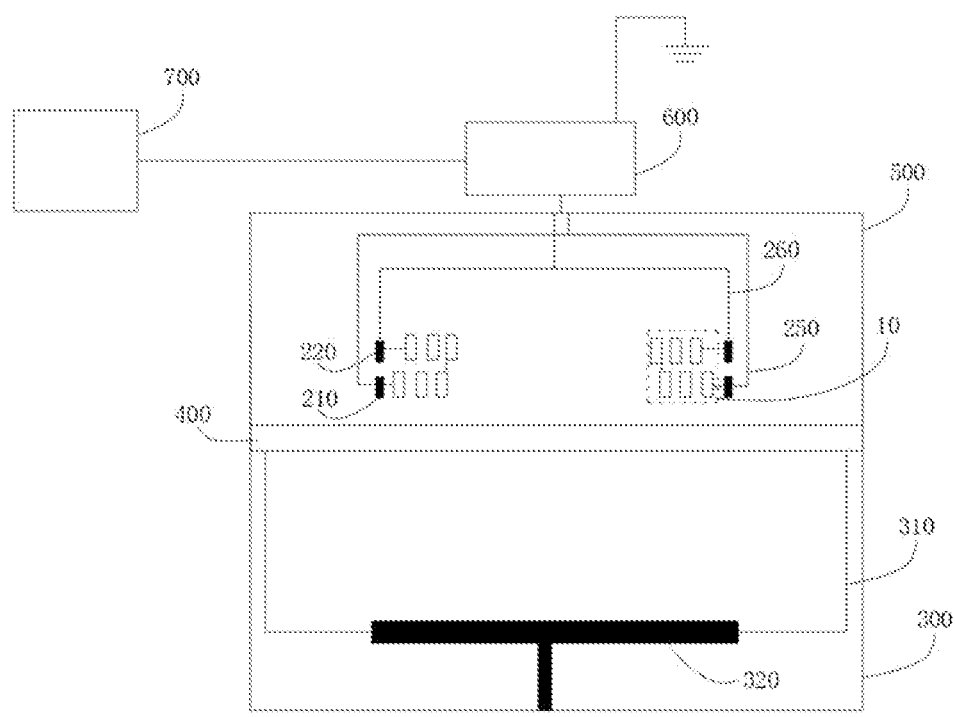
FIG. 19 is a first schematic diagram of a plasma processing apparatus provided with a connection structure and a coil structure according to some embodiments of the present disclosure.

Embodiments of the present disclosure provide a coil structure, for example, a coil structure 10 shown in FIG. 19, which is configured in a plasma processing apparatus. The plasma processing apparatus may be configured to perform an etching process on a semiconductor workpiece such as a wafer. The coil structure 10 may be used as an upper electrode to excite and generate a plasma.

Figure 3:
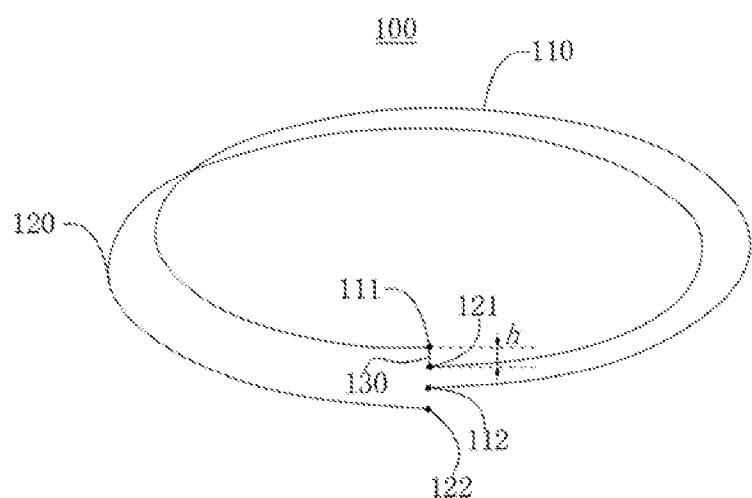
FIG. 3 is a schematic perspective diagram of a coil set of a coil structure according to some embodiments of the present disclosure.
Figure 4:
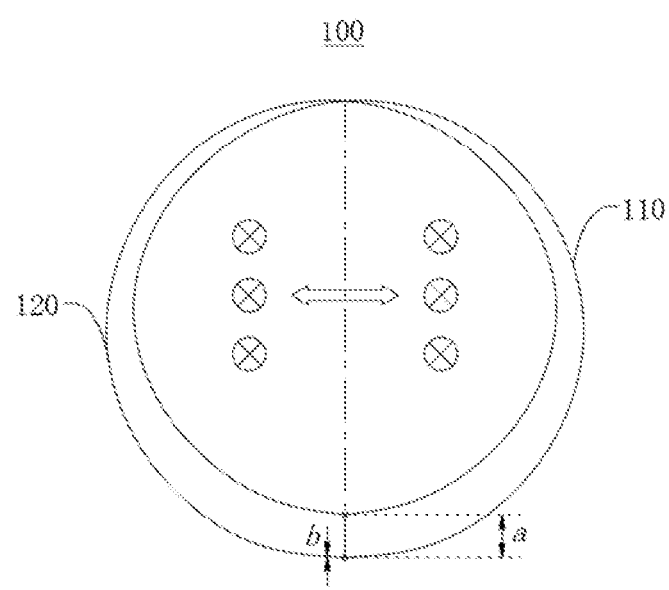
FIG. 4 is a schematic top view of FIG. 3 and schematically shows a magnetic field distribution.

The coil structure 10 includes at least one coil set 100. As shown in FIG. 3 and FIG. 4, the coil set 100 includes a first coil 110 and a second coil 120. The first coil 110 and the second coil 120 are wound to form an annular area. A first end 111 of the first coil and a first end 121 of the second coil gradually approach an inner ring of the annular area. A second end 112 of the first coil and a second end 122 of the second coil gradually approach an outer inner ring of the annular area. The first end 111 of the first coil may be electrically connected to the first end 121 of the second coil. The first coil 110 may form a first projection on a plane perpendicular to an axial direction of the coil structure 10. The second coil 120 may form a second projection on the plane perpendicular to the axial direction of the coil structure 10. The first projection and the second projection may be mirror-symmetrical to each other.

Figure 5:
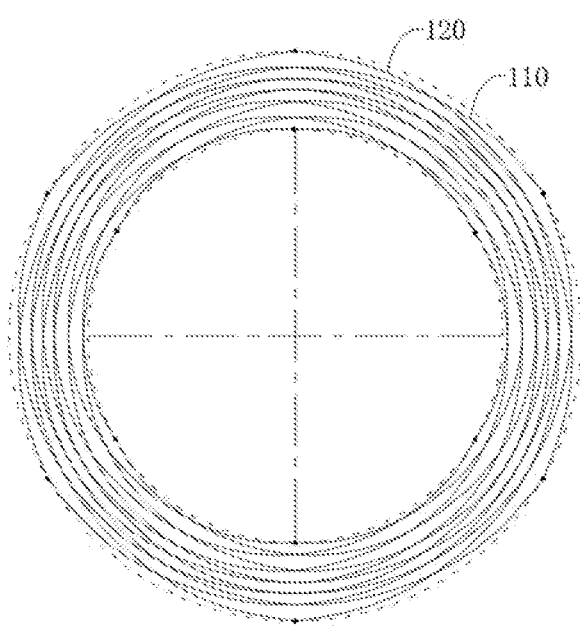
FIG. 5 is a schematic top view of a coil structure including six coil sets.
Figure 6:
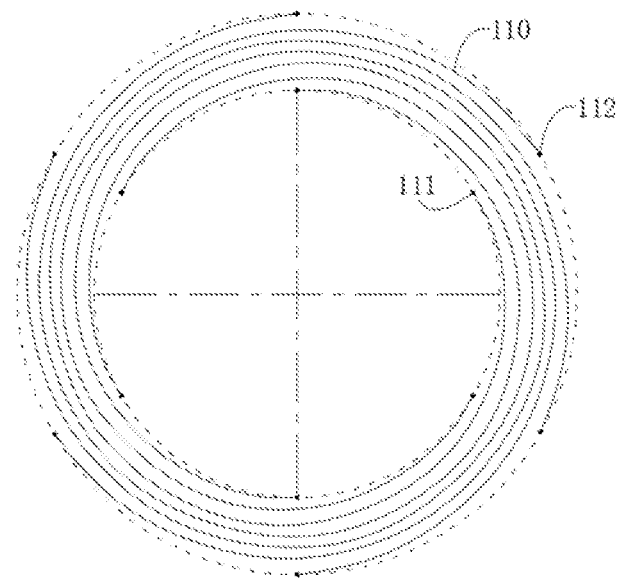
FIG. 6 is a schematic top view of six first coils in the coil structure in FIG. 5.
Figure 7:
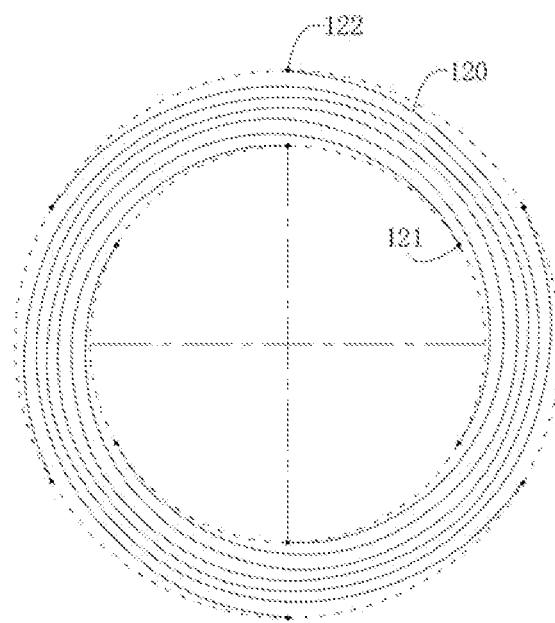
FIG. 7 is a schematic top view of six second coils in the coil structure in FIG. 5.
Figure 16:
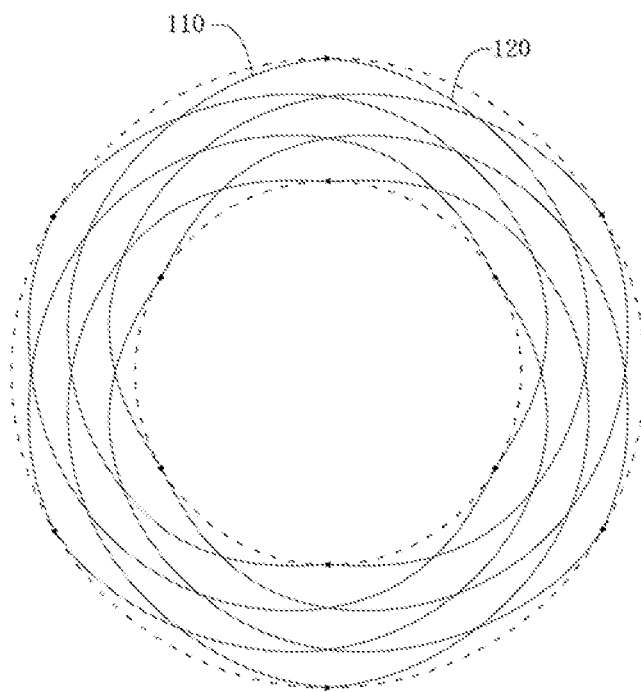
FIG. 16 is a schematic top view of a coil structure including six coil sets when both a first coil and a second coil have 0.5 turns according to some embodiments of the present disclosure.
Figure 17:
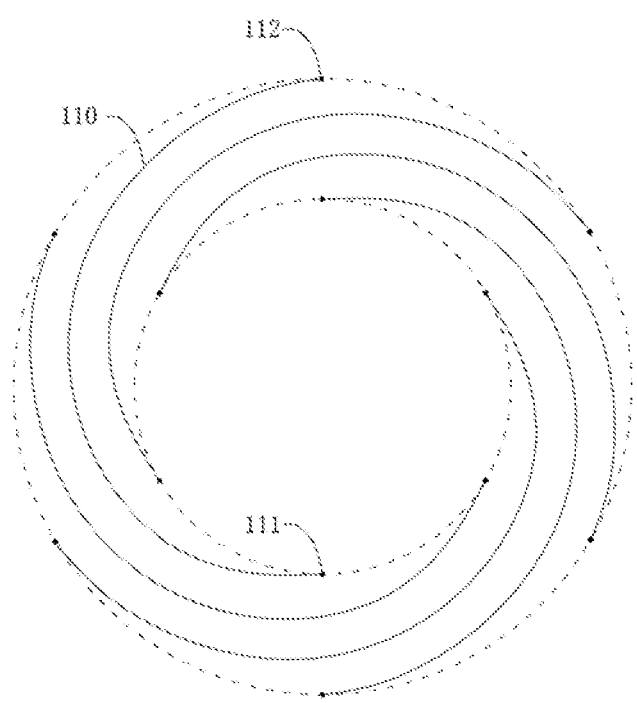
FIG. 17 is a schematic top view of six first coils in the coil structure in FIG. 16.
Figure 18:
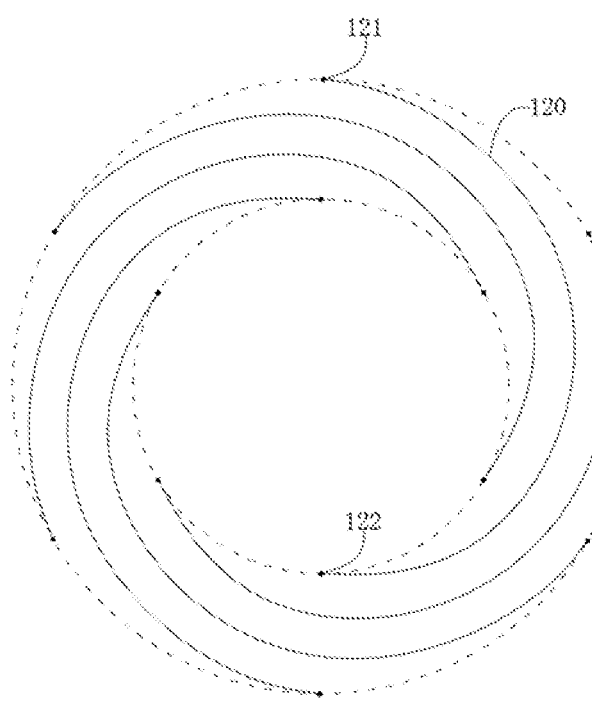
FIG. 18 is a schematic top view of six first coils in the coil structure in FIG. 16.

The annular area, as shown in FIG. 3 and FIG. 4, is formed by winding the first coil 110 and the second coil 120 and is an area where an entire coil structure 10 including at least one coil set is located. Specifically, as shown in an area indicated by dotted lines in FIG. 5 to FIG. 13, FIG. 16 to FIG. 18, and FIG. 25, in the above coil structures, a plurality of first coils 110 and a plurality of second coils 120 are wound to form an annular area, such as areas indicated by the dotted lines in FIG. 5 (coil structure 10 including six coil sets), FIG. 8 (coil structure 10 including eight coil sets), FIG. 16 (coil structure 10 including six coil sets), and FIG. 11 (including four coil sets). The first end 111 of the first coil 110 and the first end 121 of the second coil gradually approach the inner ring of the annular area. The second end 112 of the first coil 110 and the second end 122 of the second coil 120 gradually approach the outer ring of the annular area.

In the coil structure 10 used in embodiments of the present disclosure, a plane perpendicular to the axial direction of the coil structure 10 may be used as a projection plane. Take a single coil set 100 as an example, the coil set 100 may be formed by winding the first coil 110 and the second coil 120, which are electrically connected to each other. The first projection of the first coil 110 on the projection plane and the second projection of the second coil 120 on the projection plane may be mirror-symmetrical to each other on the projection plane. Thus, distributions of a magnetic field and an electric field formed by the coil set 100 may be mirror-symmetrical. For example, the magnetic field and electric field may be distributed symmetrically to the left and right. That is, left and right magnetic fields may be the same, and left and right electric fields cancel each other in opposite directions. Thus, a uniform plasma may be generated, which reduces or eliminates negative effects on the etching quality and etching efficiency of the semiconductor caused by the uneven plasma distribution in the existing technology. Thus, the etching quality and the etching efficiency of the semiconductor may be effectively improved.

Figure 14:
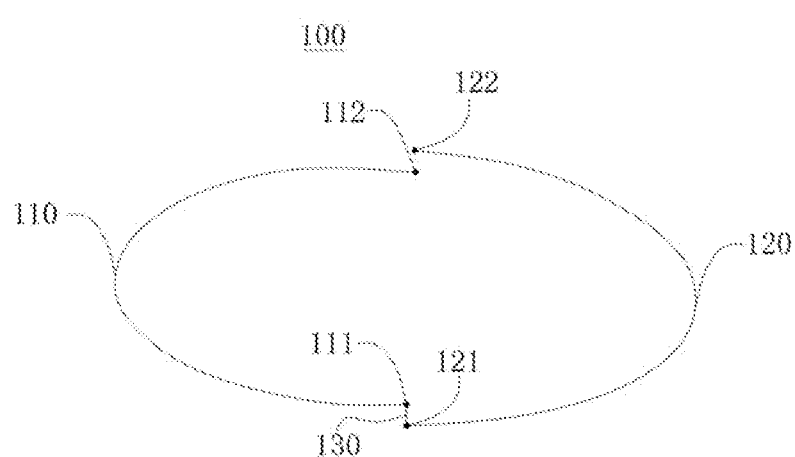
FIG. 14 is a schematic diagram of another coil set of a coil structure according to some embodiments of the present disclosure.

FIG. 3 takes as an example that both the first coil 110 and the second coil 120 are wound with one turn. The present disclosure is not limited to this. Preferably, a number of winding turns of the first coil 110 and the second coil 120 are both integer multiples of 0.5 turns. The number of turns wound by an integer multiple of 0.5 turns may facilitate processing, cause a winding manner to be more convenient and flexible, and be more beneficial to realizing the symmetrical distribution of the magnetic field and the electric field. Specifically, as shown in FIG. 14, numbers of the winding turns of the first coil 110 and the second coil 120 are both 0.5 turns.

In the present disclosure, winding trajectories of the first coil 110 and the second coil 120 may be in various ways, for example, may be both in a spiral form or an involute form as shown in FIG. 3 to FIG. 18. The annular area formed after the coil set 100 is wound can be a circular ring, an elliptical ring, a rectangular ring, a polygonal ring, etc. Due to axial position changes of the first coil 110 and the second coil 120 during the winding process, the annular area formed by winding the first coil 110 and the second coil 120 may have a certain thickness along the axial direction. The projection on a plane along the axial direction may be in an annular shape.

In addition, since the two ends of the first coil 110 gradually approach the inner and outer rings of the annular area, and the two ends of the second coil 120 gradually approach the inner and outer rings of the annular area, it can be seen that the first coil 110 and the second coil 120 are variable diameter coils with an axis center of the annular area as a center. With such an arrangement, when the coil structure 10 includes a plurality of sets of coil sets 100 that are connected in parallel, interference among the coil sets can be prevented.

Specifically, as shown in FIG. 4, in the coil set 100, the winding trajectories of the first coil 110 and the second coil 120 are both in an involute shape. A radius change amount of each turn of the first coil 110 and the second coil 120 may be set to a=60 mm in a radial direction (i.e., radial distance between two turns), and a coil width may be set to b=4 mm. A cross symbol in the figure may represent a magnetic field direction and relative size and distribution at a certain time, which is distributed symmetrically in the left and right. The radial electric field distribution is shown by arrows in the figure, which cancels each other out with equal sizes and opposite directions.

It should be noted that, in embodiments of the present disclosure, for an electrical connection position between the first coil 110 and the second coil 120, besides the above electrical connection between the first end 111 of the first coil and the first end 121 of the second coil, the second end 112 of the first coil may be electrically connected to the second end 122 of the second coil.

In embodiments of the present disclosure, the first coil 110 and the second coil 120 of the coil set 100 may be arranged in an up-down direction at an interval. With such an arrangement, capacitive coupling between the upper and lower layers of coils may be reduced. In addition, arranging the first coil 110 and the second coil 120 at the interval may not only facilitate the winding of a single coil set 100, but also facilitate the winding of a plurality of coil sets 100 to avoid interference between the coil sets. Such an arrangement not only can facilitate the electrical connection between the first coil 110 and the second coil 120 but also can facilitate the setting of a frequency feeding position and a grounding position.

With reference to FIG. 3 and FIG. 14, in embodiments of the present disclosure, along an axial direction of the coil structure 10, in the coil set 100, the first end 111 of the first coil and the first end 121 of the second coil are arranged at an interval in the up-down direction. The second end 112 of the first coil and the second end 122 of the second coil are arranged at an interval in the up-down direction. A connection line between the first end 111 of the first coil and the first end 121 of the second coil may be parallel to the axis of the coil structure 10. A connection line between the second end 112 of the first coil and the second end 122 of the second coil may be parallel to the axis of the coil structure 10. Specifically, in embodiments of the present disclosure, as shown in FIG. 3 and FIG. 14, a connection manner between the first coil 110 and the second coil 120 is that the first end 111 of the first coil and the first end 121 of the second coil are connected by a vertical connection bar 130. The vertical connection bar 130 may be parallel to the axial direction of the coil structure 10. Thus, the electrical connection between the first coil 110 and the second coil 120 may be realized, and the connection method may have advantages that the connection is simple and effective.

In embodiments of the present disclosure, an axial distance between the first coil 110 and the second coil 120 in an up-down direction may be adjustable. Specifically, by changing an effective connection length of the vertical connection bar 130 between the first coil 110 and the second coil 120, the axial distance between the first coil 110 and the second coil 120 in the up-down direction may be changed. Thus, the capacitive coupling between the upper and lower layers of the coils may be adjusted to further reduce the interference between the coil sets 100.

In embodiments of the present disclosure, the first coil 110 and the second coil 120 are both helical coils and both are wound spirally upward or downward along the axial direction of the coil set 100. That is, the two ends of the first coil 110 may be on different planes after the first coil 110 is wound, and the two ends of the second coil 120 may be on different planes after the second coil 120 is wound. Specifically, as shown in FIG. 5 to FIG. 13, FIG. 16 to FIG. 18, and FIG. 25, the coil structure 10 includes at least two coil sets 100. The first ends 111 of the first coils of the at least two coil sets 100 are both on a first plane. The first ends 121 of the second coils of the at least two coil sets are both on a second plane. The second ends 112 of the first coils of the at least two coil sets 100 are both on a third plane. The second ends 122 of the second coils of the at least two coil sets 100 are both on a fourth plane. A predetermined distance may exist between the first plane and the second plane (as shown in FIG. 3, h is the predetermined distance). The predetermined distance may also exist between the third plane and the fourth plane. The predetermined distance may be the distance between the first coil 110 and the second coil 120 of the coil set 100. By setting the predetermined distance, the capacitive coupling between the two layers of coils may be reduced. Preferably, the predetermined distance may be set to 10 mm, as shown in FIG. 3, h=10 mm.

With reference to FIG. 3, a number of winding turns of the first coil 110 and the second coil 120 of the coil set 100 is one turn. The first coil 110 descends spirally from the first end to the second end. The second coil 120 also spirally descends from the first end to the second end. The first end 111 of the first coil and the first end 121 of the second coil may be electrically connected through the vertical connection bar 130. The vertical connection bar 130 and the connection line between the second end 112 of the first coil and the second end 122 of the second coil may be parallel to the axial direction of the coil structure 10. The first end 111 of the first coil may be located on the first plane. The second end 112 of the second coil may be located on the third plane. The first end 121 of the second coil may be located on the second plane. The second end 122 of the second coil may be located on the fourth plane. The four planes are located at different positions. A distance (i.e., the predetermined distance) between the first plane and the third plane may be equal to a distance between the second plane and the fourth plane.

Figure 15:
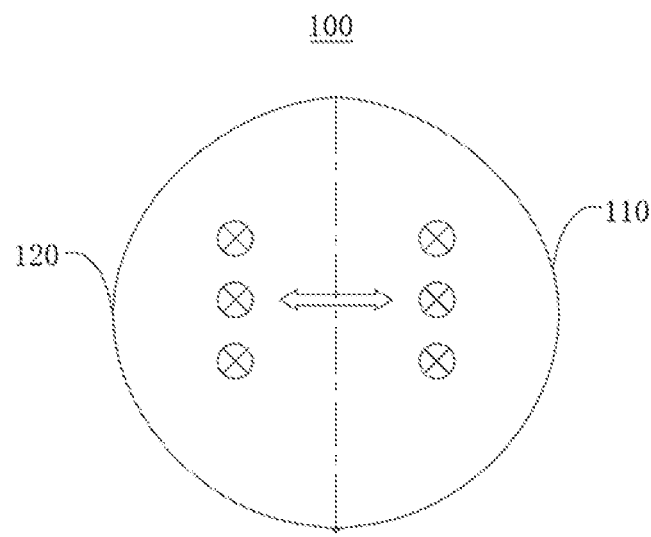
FIG. 15 is a schematic top view of FIG. 14 and shows a magnetic distribution diagram.

With reference to FIG. 14, numbers of winding turns of the first coil 110 and the second coil 120 of the coil set 100 are both 0.5 turns. The first coil 110 spirally descends from the first end to the second end. The second coil 120 spirally ascends from the first end to the second end. The first end 111 of the first coil and the first end 121 of the second coil may be electrically connected through the vertical connection bar 130. The vertical connection bar 130 and the connection line between the second end 112 of the first coil and the second end 122 of the second coil may be parallel to the axial direction of the coil structure 10. The first end 111 of the first coil is located on the first plane. The second end 112 of the first coil is located on the third plane. The first end 121 of the second coil is located on the second plane. The second end 122 of the second coil is located on the fourth plane. The first plane and the fourth plane are coplanar. The second plane and the third plane are coplanar. Thus, the predetermined distance between the first plane and the third plane is equal to the predetermined distance between the second plane and the fourth plane. FIG. 15 is a schematic top view and a magnetic field distribution diagram of the coil set 100.

In addition to the first end and the second end of different coil sets in the coil structure 10 being located on the first plane and the second plane, respectively, when the coil structure 10 includes the at least two parallelly-connected coil sets 100, the at least two coil sets 100 may also be arranged along the axial direction of the coil structure 10 at intervals. First ends of different coil sets 100 may be located at different heights in the axial direction, and second ends may be located at different heights in the axial direction. Thus, the capacitive coupling between different coils may be reduced, and the interference formed by the winding process of different coil sets 100 may be reduced. Specifically, along the axial direction of the coil structure 10, the axial distance between neighboring coil sets may be adjustable. A distributed capacitance may exist between the first coil and the second coil of the plurality of coil sets. A capacitance value may be related to the distance between the two layers of coils. The first coil and the second coil may be set with an adjustable distance. By adjusting the distance of the two layers, the distributed capacitance may be adjusted. Thus, a coil resonance frequency and a coil inductance value of the coil structure 10 may be adjusted. In addition, during the winding process, the axial distance of the coil sets may be adjusted according to the capacitive coupling requirements and the connection position requirements of the coil sets and the connection structure. Thus, the applicability of the coil structure 10 may be improved.

Figure 8:
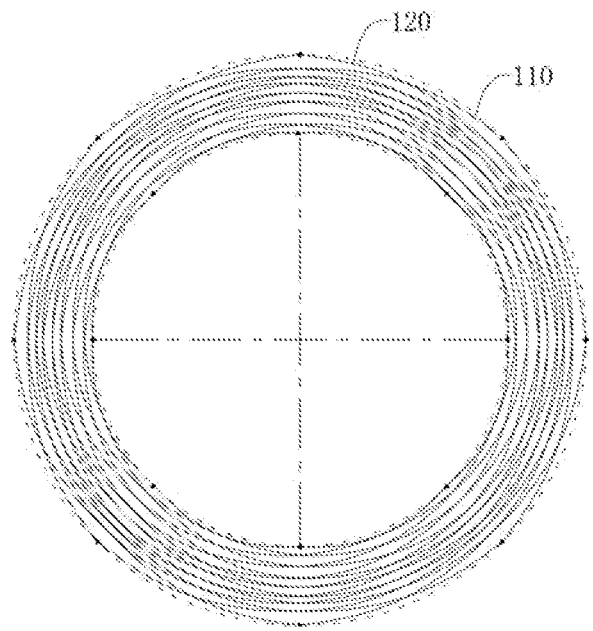
FIG. 8 is a schematic top view of a coil structure including eight coil sets.
Figure 9:
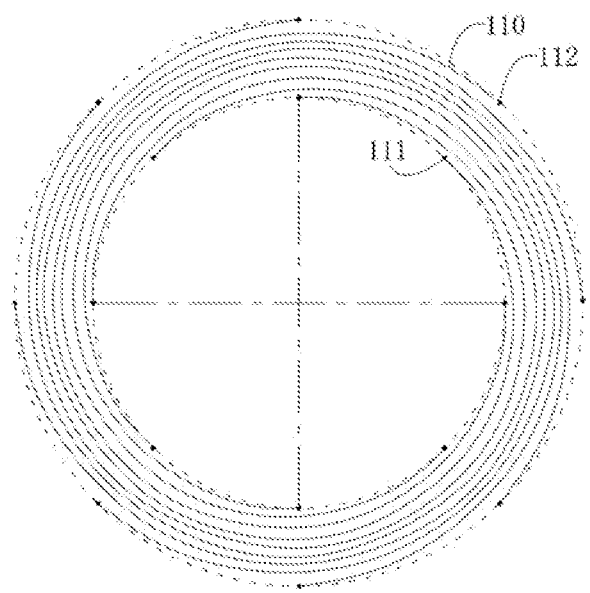
FIG. 9 is a schematic top view of eight first coils in the coil structure in FIG. 8.
Figure 10:
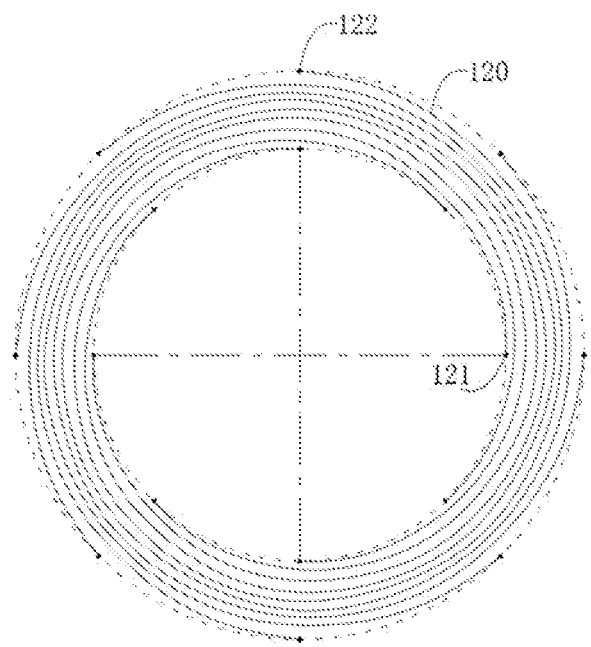
FIG. 10 is a schematic top view of eight second coils in the coil structure in FIG. 8.
Figure 11:
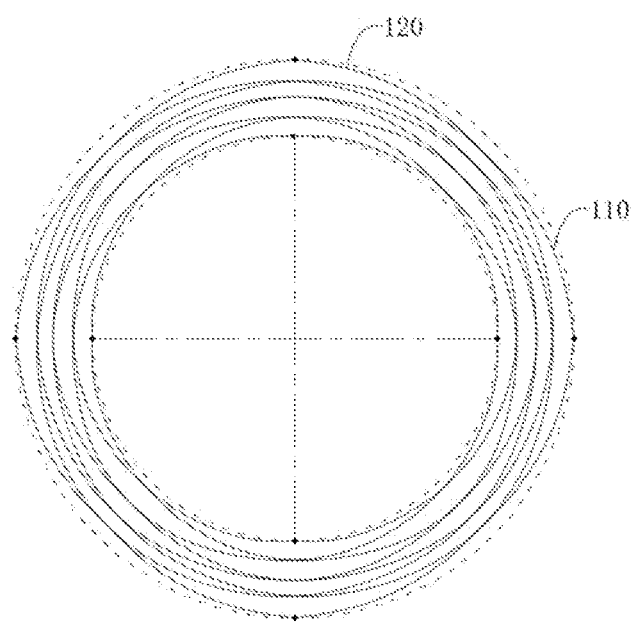
FIG. 11 is a schematic top view of a coil structure including four coil sets.
Figure 12:
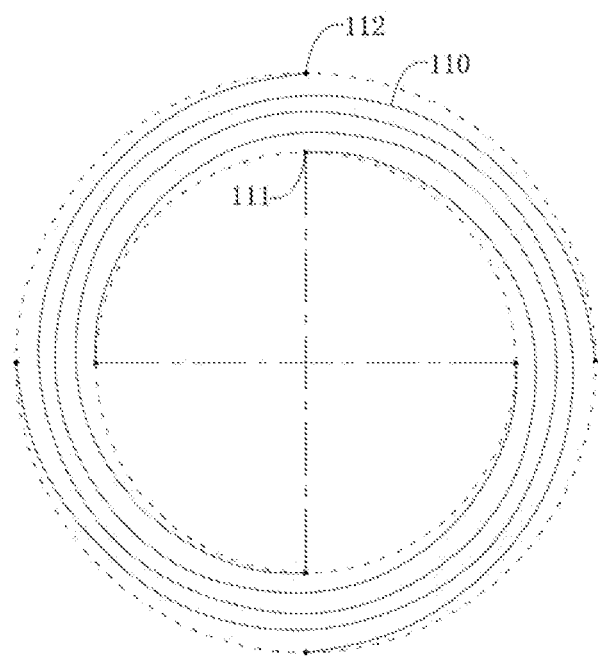
FIG. 12 is a schematic top view of four first coils in the coil structure in FIG. 11.
Figure 13:
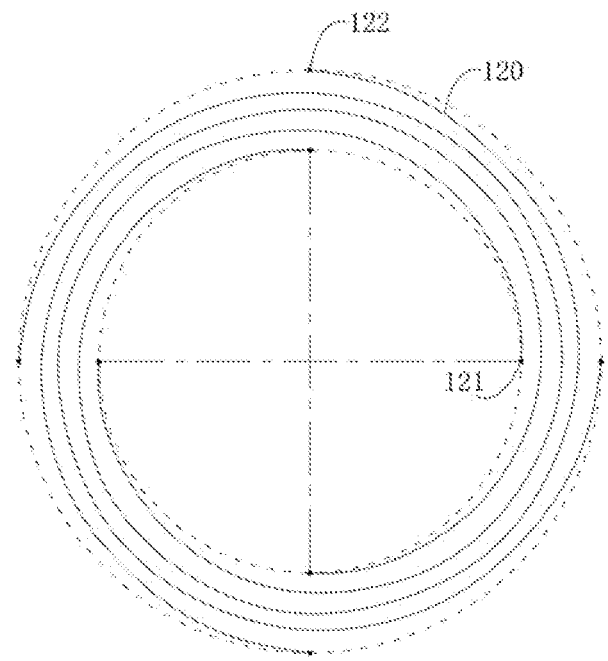
FIG. 13 is a schematic top view of four second coils in the coil structure in FIG. 11.

In embodiments of the present disclosure, as shown in FIG. 5 to FIG. 13, FIG. 16 to FIG. 18, and FIG. 25, in the at least two coil sets 100 of the coil structure 10, the first ends 111 of the first coils of the coil sets 100 are uniformly arranged along a circumferential direction of the coil structure 10. The second ends 112 of the first coils of the coil sets 100 are uniformly arranged along the circumferential direction of the coil structure 10. In the coil structure 10, the first end of the second coil 120 is connected to the first end of the first coil 110. The first ends 121 of the second coils and the second ends 122 of the second coils are also uniformly arranged along the circumferential direction of the coil structure 10 to ensure an angular symmetry of plasma distribution generated by the coil structure 10. The more the coil sets 100 are provided, the better the angular symmetry of the plasma distribution is, and the more uniform the plasma distribution is. Preferably, the coil structure 10 may include an even number of coil sets, specifically four sets (as shown in FIG. 11 to FIG. 13), six sets (as shown in FIG. 5 to FIG. 7, FIG. 16 to FIG. 18, and FIG. 25), or eight sets (as shown in FIGS. 8 to 10) of coil sets 100.

The coil structure 10 may include four coil sets. As shown in FIG. 11 to FIG. 13, the coil structure 10 is formed and wound by electrically connecting the four coil sets 100 in parallel. Four first coils 110 are included and are angularly symmetrical at 90°. Four second coils 120 are included and are angularly symmetrical at 90°. The coil structure 10 includes may include six coil sets. As shown in FIG. 5 to FIG. 7, FIG. 16 to FIG. 18, and FIG. 25, the coil structure 10 is formed and wound by electrically connecting the six coil sets in parallel. Six first coils 110 are included and are angularly symmetrical at 60°. Six second coils 120 are provided and are angularly symmetrical at 60°. The coil structure 10 may include eight coil sets. As shown in FIG. 8 to FIG. 10, the coil structure 10 is formed by electrically connecting eight coil sets 100 in parallel. Eight first coils 110 are provided and are angularly symmetrical at 45°. Eight second coils 120 are provided and are angularly symmetrical at 45°. In all the above coil structures 10, on a projection plane perpendicular to the axial direction of the coil structure 10, the first projection of the first coil 110 is mirror-symmetrical to the second projection of the second coil 120 of the coil sets 100. Thus, the magnetic field and electric field of the coil sets 100 may be ensured to be symmetrically distributed at left and right. Along the circumferential direction of the coil structure 10, the six coil sets 100 may be arranged uniformly at an interval of 60°. Thus, the magnetic field and electric field of the plurality of coil sets 100 may be uniformly distributed along the circumferential direction of the coil structure 10. Thus, the plasma generated by the coil structure 10 may be ensured to be distributed uniformly.

Specifically, in embodiments of the present disclosure, longitudinal cross-sectional shapes of the first coil 110 and the second coil 120 may be selected as a rectangle. In addition, the longitudinal cross-sectional shape of the first coil 110 and the second coil 120 may also be selected as a ring or a circle, that is, a hollow coil or a solid coil, which is not limited in the present disclosure. The coil has the advantages of easy material availability and strong applicability.

Embodiments of the present disclosure further provide a plasma processing apparatus. As shown in FIG. 19, the plasma processing apparatus includes a radio frequency (RF) source 700, a reaction chamber 300, a dielectric member 400 arranged on the top of the reaction chamber 300, and the coil structure 10 of the above embodiments. The coil structure 10 including at least one coil set 100 may be arranged on the dielectric member 400. The radio frequency source 700 may be configured to provide RF power to the coil structure 10. Since the plasma processing apparatus has the above coil structure 10, the plasma processing apparatus may have all the beneficial effects of the above coil structure 10, which is not repeated here.

Optionally, in embodiments of the present disclosure, as shown in FIG. 19 to FIG. 25, the plasma processing apparatus further includes a connection structure 200. The connection structure 200 includes a first connection member 210 and a second connection member 220. The second end 112 of the first coil 110 in each coil set 100 may be electrically connected to the first connector 210. The second end 122 of the second coil 120 in each coil set 100 may be electrically connected to the second connector 220. One of the first connector 210 and the second connector 220 may be configured to input RF power. The other one may be configured to be grounded. With such an arrangement, a complete circuit path may be formed to complete the plasma generation process. Specifically, the first connector 210 may be connected between the second end 112 of the first coil 110 and the RF source 700. The second connector 220 may be connected between the second end 122 of the second coil and the ground. The RF source may be configured to provide RF energy to the coil structure 10 through the first connector 210. A coil magnetic field (induced magnetic field formed by the coil structure 10) may be generated in the reaction chamber by the coil structure 10 to generate the plasma.

Figure 20:
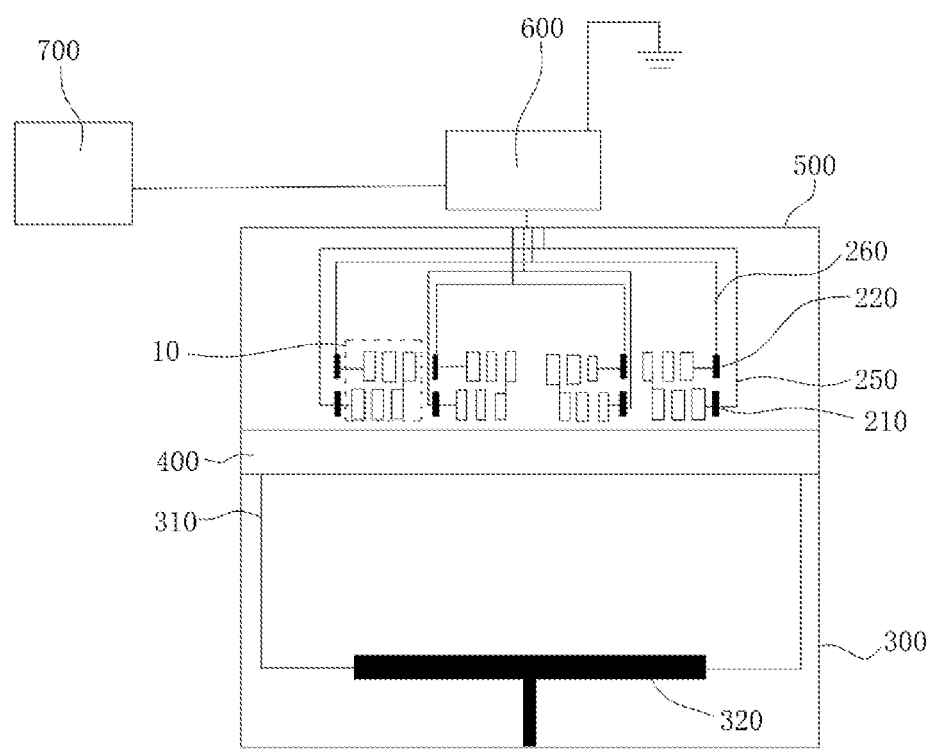
FIG. 20 is a second schematic diagram of a plasma processing apparatus provided with two connection structures and two coil structures with the two coil structures being sleeved along a radial direction at an interval according to some embodiments of the present disclosure.
Figure 21:
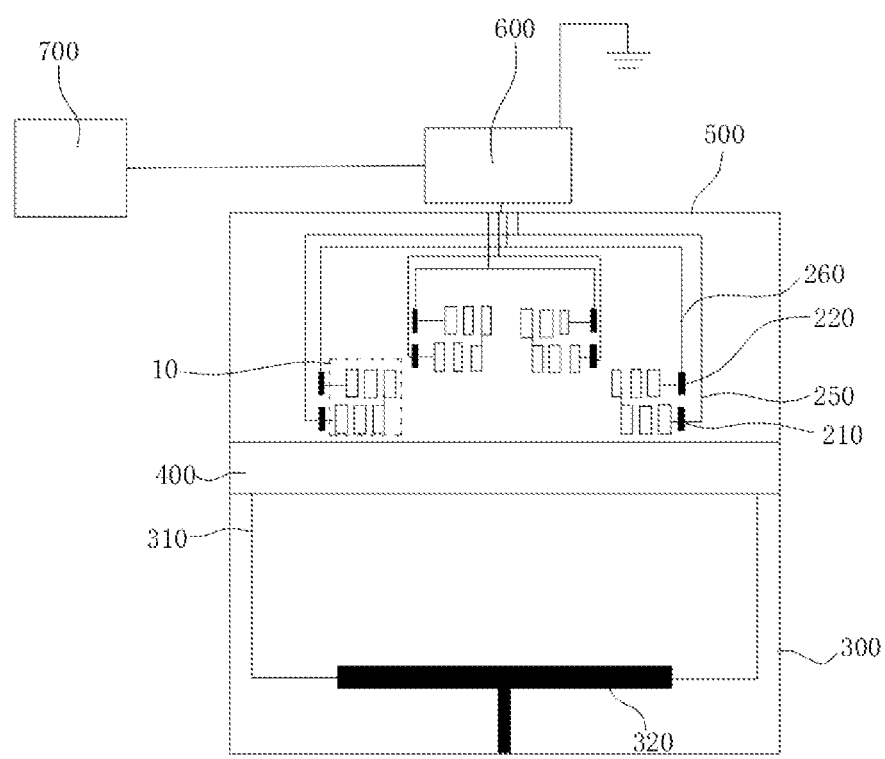
FIG. 21 is a third schematic diagram of a plasma processing apparatus being provided with two connection structures and two coil structures with the two coil structures being arranged along an axial direction at an interval according to some embodiments of the present disclosure.
Figure 22:
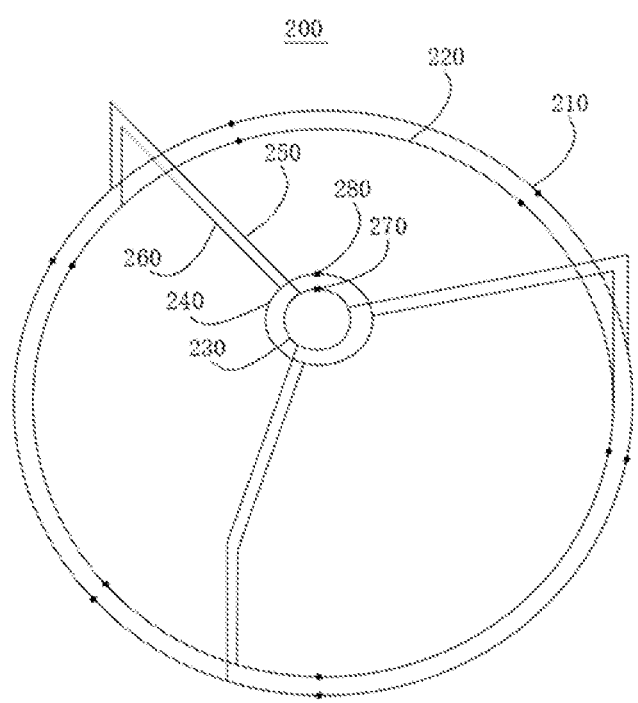
FIG. 22 is a schematic perspective diagram of a coil structure when a connector of a connection structure is a closed ring according to some embodiments of the present disclosure.
Figure 23:
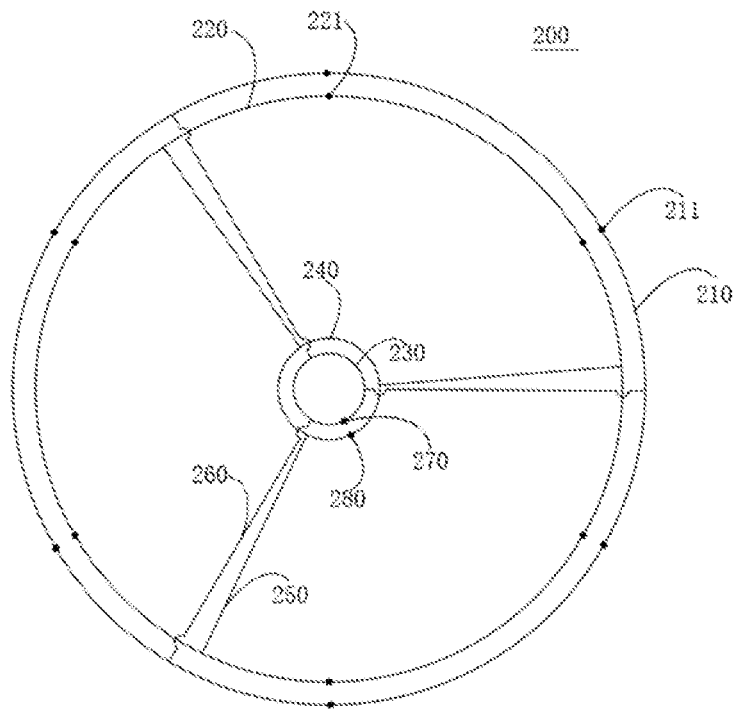
FIG. 23 is a schematic top view of FIG. 22.
Figure 24:
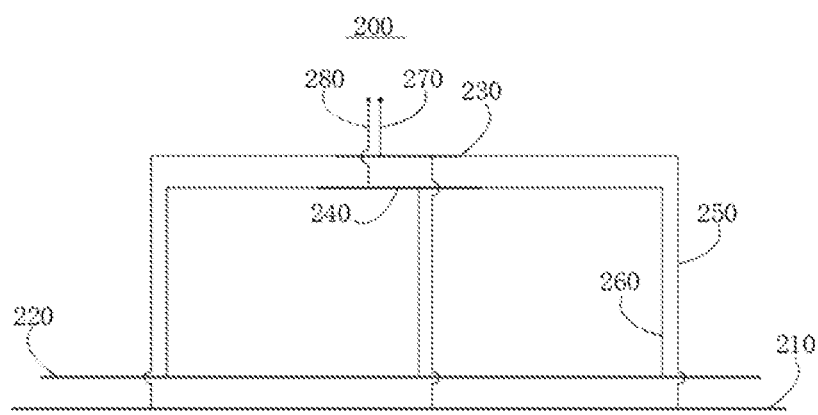
FIG. 24 is a schematic main view of FIG. 22.

In the plasma processing apparatus of embodiments of the present disclosure, at least two coil structures 100 may be provided. A number of connection structures 200 may be equal to the number of coil structures 10. The connection structure 200 may be electrically connected to one of the coil structures 10. As shown in FIG. 20, the at least two coil structures 10 may be sleeved at an interval along the radial direction. That is, all the coil sets of a single coil structure 10 may form a complete coil. Complete coils of different coil structures 10 may be approximately at a same height and are sleeved in sequence. Alternatively, as shown in FIG. 21, the at least two coil structures 10 are arranged at an interval along the axial direction. Along the axial direction, radial dimensions of the at least two coil structures 10 gradually increase or decrease. All coil sets of the single coil structure 10 may form a complete coil. Complete coils of different coil structures 10 may be arranged approximately coaxially and are located at different heights. Along the axial direction, a radial dimension of the complete coil may increase gradually or decrease gradually to form a structure in an approximately conical shape. During the processing process, the connection structures 200 may be connected to the coil structures 10 in a one-to-one correspondence. The RF source 700 may provide RF energy to the plurality of complete coils through the plurality of connection structures 200. Thus, the coil magnetic fields generated by the plurality of complete coils may be coupled to obtain a coupled induction magnetic field with a higher magnetic field amplitude and a larger magnetic radial continuous distribution range. Thus, the density and distribution uniformity of the plasma generated in the reaction chamber 300 may be further improved. Correspondingly, productivity and uniformity of using the plasma to perform processing on the product may be further improved. In addition, by using the arrangement manner along the radial direction or the circumferential direction at intervals, the interference between neighboring coil structures 10 may be effectively reduced to ensure the arrangement of the plurality of coil structures 10. Specifically, two or three coil structures 10 may be provided. A number of corresponding connection structures may be the same as the number of the coil structures 10. The arrangement manner may be adjusted according to the shapes of the corresponding coil structures 10. Thus, the RF may be ensured to be fed uniformly, and the plurality of coil structures 10 may be connected in parallel. The plurality of coil sets of each coil structure 10 may be connected in parallel. Thus, the uniformity of the electromagnetic field generated by the coupling of the coil structure 10 may be further improved.

Figure 25:
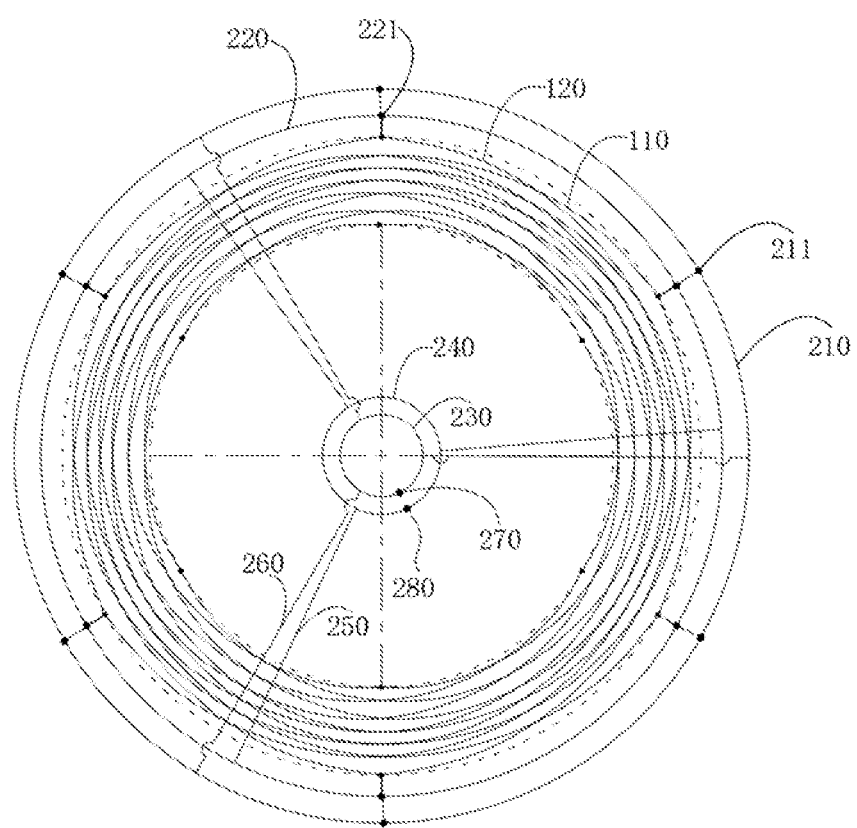
FIG. 25 is a schematic top view of a total assembly of a coil structure adopting the connection structure of FIG. 22 according to some embodiments of the present disclosure.

With reference to FIG. 22 to FIG. 25, specifically, the first connector 210 and the second connector 220 are both annular structures with a certain thickness. The first connector 210 and the second connector 220 may be arranged at an interval along the axial direction of the coil structure 10. With such an arrangement, the plurality of first connection member 211 may be arranged through the first connector 210. The plurality of first connection member 211 may be connected to the second ends 112 of the first coils 110 in the plurality of coil sets 100. The plurality of second connection member 221 may be arranged through the second connector 220. By connecting the second ends 122 of the second coils 120 in the plurality of coil sets 100 may be connected. Thus, the plurality of coil sets 100 including the first coils 110 and the second coils 120 may be connected in parallel. In embodiments of the present disclosure, preferably, the number of the first connection members 211 provided on the first connector 210 and the number of the second connection members 221 provided on the second connector 220 may be the same as the number of the coil sets. As shown in FIG. 25, the coil structure 10 includes six coil sets, including six first coils 110 and six second coils 120. Correspondingly, six first connection members 211 may be provided and may be electrically connected to the second ends 112 of the six first coils 110 in a one-to-one correspondence. Six second connection members 221 may be provided and electrically connected to the second ends 122 of the six second coils 120. The connection structure may have advantages of being simple, convenient, and effective.

It should be noted that the radial dimensions of the first connector 210 and the second connector 220 may be equal or unequal. For example, the radial dimension of the first connector 210 may be larger than the radial dimension of the second connector 220. When the radial dimensions of the first connector 210 and the second connector 220 are not equal, the first connector 210 and the second connector 220 may be located in the same plane.

With reference to FIG. 22 to FIG. 25, in the coil structure 10, the connection structure 200 further includes a third connector 230 and a fourth connector 240. The third connector 230 may be electrically connected to the first connector 210 through the first connection bar 250. The fourth connector 240 may be electrically connected to the second connector 220 through the second connection bar 260. The third connector 230 includes a power input end 270 configured to input RF power. The fourth connector 240 includes a ground end 280, which is configured to be grounded. With such an arrangement, a complete circuit path may be formed. Thus, the plasma generation process may be completed. It should be noted that, in addition to arranging the power input end 270 on the third connector 230 and arranging the ground end 280 on the fourth connector 240, the power input end 270 may also be arranged on the fourth connector 240. The ground end 280 may be arranged on the third connector 230, which is not limited herein.

Specifically, as shown in FIG. 22 to FIG. 25, in embodiments of the present disclosure, the third connector 230 and the fourth connector 240 are both arranged as annular structures. The third connector 230 and the fourth connector 240 are arranged at an interval along the axial direction of the coil structure 10. The third connector 230 and the fourth connector may be located above the first connector 210 and the second connector 220. The third connector 230 is located above the fourth connector 240. One end of the first connection bar 250 is electrically connected to the first connector 210, and the other end is electrically connected to the third connector 230. Thus, the electrical connection between the first connector 210 and the third connector 230 may be achieved. One end may be electrically connected to the second connector 220. The other end may be electrically connected to the fourth connector 240. Thus, the electrical connection between the second connector 220 and the fourth connector 240 may be realized. It can be seen from FIG. 22 to FIG. 25, with such an arrangement, the second connector 220, the second connection bar 260, and the fourth connector 240 may be covered by an area enclosed by the first connector 210, the first connection bar 250, and the third connector 230. Thus, the interference between the connectors and the connection bars may be avoided without the need to perform, for example, a bending process on the connectors and connection bars.

It needs to be noted that, in embodiments of the present disclosure, a plurality of first connection bars 250 and a plurality of second connection bars 260 may be provided. The plurality of first connection bars 250 and the plurality of second connection bars 260 may be uniformly arranged along the circumferential direction of the coil structure 10. As shown in FIG. 22 to FIG. 25, three first connection bars 250 and three second connection bars 260 are provided. That is, along the circumferential direction of the first connector 210 or the second connector 220, an angle between neighboring connection bars may be 120°. The connection bars may be in an inverted "L" shape, which can be obtained by simply bending, and has the advantages of simple structure and low production cost. The protected solution of the present disclosure is not limited to this. A connection bar of another arrangement form may also be used, as long as having the connection functions of the above connection bars, and the connection bar is within the scope of the present disclosure.

Figure 26:
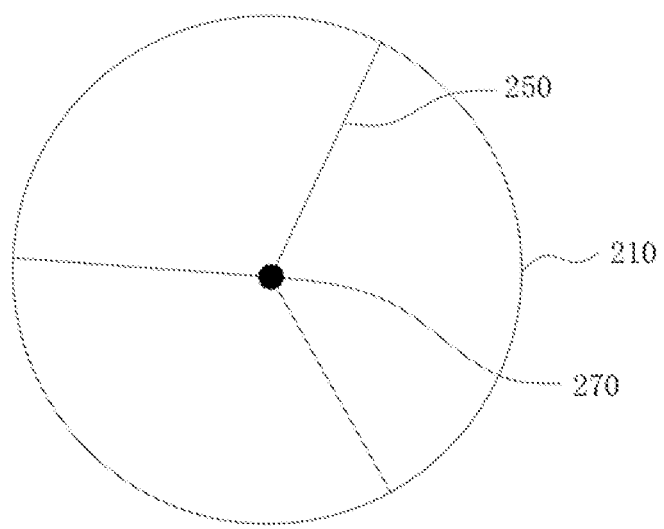
FIG. 26 is a schematic diagram of a coil structure when a first connector of a connection structure is a closed ring, and a second end of a first connection bar is connected to a point according to some embodiments of the present disclosure.

Optionally, in embodiments of the present disclosure, the connection structure 200 may not be provided with the third connector 230 and the fourth connector 240. As shown in FIG. 25 and FIG. 26, ends of the plurality of first connection bars 250 are electrically connected to the first connector 210, and the other ends are connected to a point as a power input end 270, which is configured to input RF power. Ends of the plurality of second connection bars 250 are electrically connected to the second connector 220, and the other ends are connected to a point as a ground end 280, which is configured to be grounded.

In addition to the above closed ring form, the connector of the connection structure 200 may also adopt a form of a connection segment. As shown in FIG. 32 to FIG. 40, the connection structure is applied to the electrical connection of the coil set 100 with the RF source 700 and the ground in the plasma processing apparatus. The second end 112 of the first coil in each coil set 100 may be set as an input end. The second end 122 of the second coil may be set as an output end. The first connector 210 of embodiments of the present disclosure may include the first connection segment 212. The first connection segment 212 may be connected to the input end. A number of input ends connected to each first connection segment 212 may be at least one. The second connector 220 may include a second connection segment 222. The second connection segment 222 may be connected to the output end. A number of output ends connected to each second connection segment 222 may be at least one. The connection structure with such the connection form may be applied to the plasma processing apparatus. The first connection segment 212 of the first connector 210 may be connected between the input end of the coil set 100 and the RF source 700. The second connection segment 222 of the second connector 220 may be connected between the output end of the coil set 100 and ground. The RF source 700 may provide RF energy to the coil structure 10 through the first connection segment 212. The coil structure 10 may generate the coil magnetic field. Since the first connection segment 212 and the second connection segment 222 are in a state that two ends are disconnected, the first connector 210 and the second connector 220 corresponding to the first connection segment 212 and the connection segment 222 may be in an unclosed ring shape. Thus, the first connector 210 and the second connector 220 may not be induced to generate reverse current opposite to a current direction of the coil structure 10 under the action of the coil magnetic field. Correspondingly, the first connector 210 and the second connector 220 may not generate a reverse induced magnetic field that can weaken the coil magnetic field and may not block the coil magnetic field. Thus, the radial continuous distribution range of the magnetic field amplitude value and magnetic field may be ensured to further improve the density and uniformity of the plasma generated in the reaction chamber 300. Correspondingly, the productivity and uniformity of using the plasma to perform processing on the product may be ensured.

Of course, in other embodiments of the present disclosure, only one of the first connector 210 and the second connector 220 may have the form of the connection segment. The RF source 700 may provide RF energy to the coil structure 10 through the connector. The connector may not generate a reverse current that is opposite to the current direction of the coil structure 10, correspondingly, may not generate a reverse induced magnetic field that can weaken the coil magnetic field, and may not block the coil magnetic field. Thus, the weakening effect of the connection structure to the coil magnetic field may be effectively reduced, and correspondingly the magnetic amplitude value of the coil magnetic field may be improved to further improve the density of the plasma in the reaction chamber.

Figure 32:
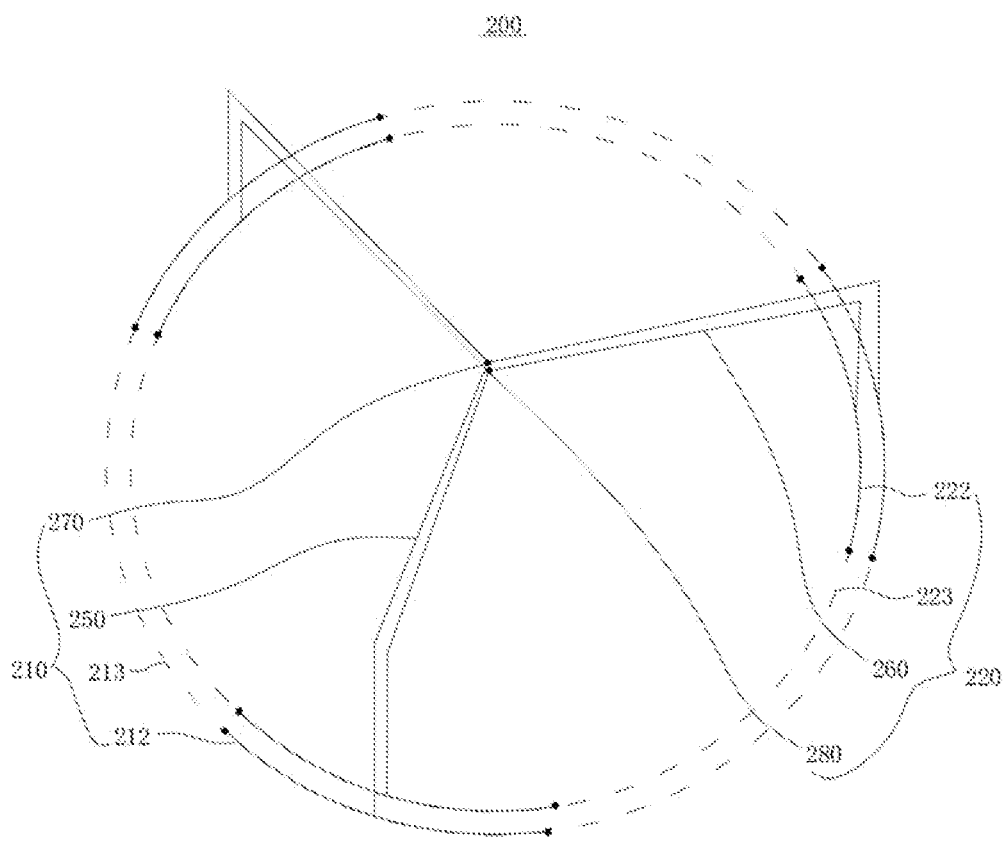
FIG. 32 is a schematic perspective structural diagram of a coil structure when a connector of a connection structure is a connection segment according to some embodiments of the present disclosure.
Figure 33:
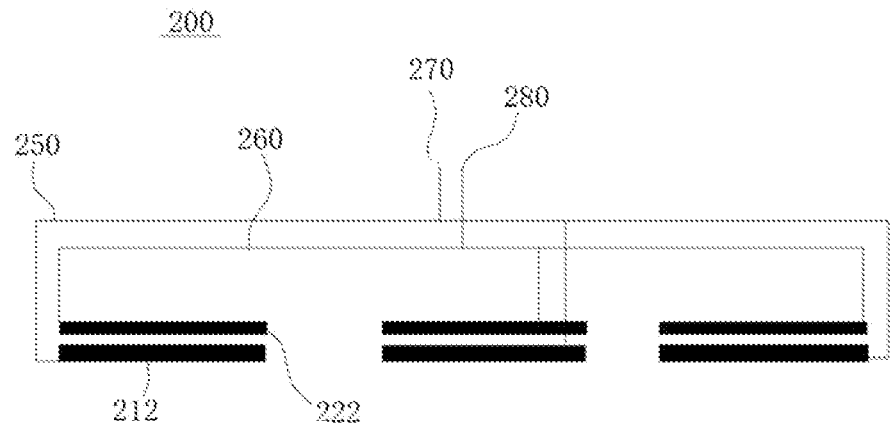
FIG. 33 is a schematic main view of FIG. 32.

Optionally, as shown in FIG. 32 and FIG. 33, in the plasma processing apparatus of embodiments of the present disclosure, the coil structure 10 includes a plurality of coil sets 100. The first connector 210 includes at least two first connection segments 212. The at least two first connection segments 212 are arranged at intervals along the circumferential direction to enclose to form a first contour 213. A number of coil sets 100 is twice a number of the first connection segments 212. A number of input ends connected to each first connection segment 212 is two. The second connector 220 may include at least two second connection segments 222. The at least two second connection segments 222 are arranged at intervals in the circumferential direction to form a second contour 223. A number of coil sets 100 is twice the number of the second connection segments 222. A number of the output ends connected to each second connection segment 222 is two. The connection structure 200 may be used in the coil structure 10 including the plurality of output ends and the plurality of input ends. When connecting, the input ends are connected to the first connection segment 212. Each first connection segment 212 may be ensured to be connected to two input ends. The first connection segment 212 is connected to the RF source 700. The output ends are connected to the second connection segment 222. Each second segment 222 may be ensured to be connected to two output ends. The second connection segment 222 is electrically connected to the ground. During a processing process, the RF source 700 may apply RF energy to the coil structure 10 through the first connection segment 212. The coil structure 10 may generate a plurality of induced magnetic fields. The plurality of induced magnetic fields may be coupled to form a coil magnetic field with a higher magnetic field amplitude value. Correspondingly, the plasma with higher density may be generated in the reaction chamber 300, which has a higher processing capacity for the products.

Figure 34:
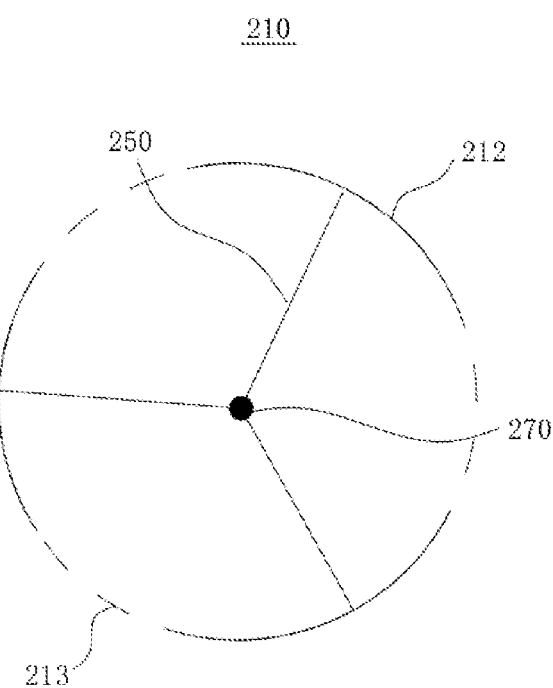
FIG. 34 is a schematic diagram of a coil structure when a first connector of a connection structure is a connection segment, and a second end of a first connection bar is connected to a point according to some embodiments of the present disclosure.

Further, as shown in FIG. 32, in the connection structure 200 of the plasma processing apparatus of embodiments of the present disclosure, the first contour 213 is annular, and the second contour 223 is annular. The plurality of first connection segments 212 are arranged at intervals along the circumferential direction of the first contour 213. The plurality of second connection segments 222 are arranged at intervals along the circumferential direction of the second contour 223. The interference caused by connecting the plurality of input ends and the plurality of output ends to the corresponding connection segments may be reduced. Specifically, as shown in FIG. 32 to FIG. 34, the first connector 210 includes three first connection segments 212 arranged at intervals. The second connector 220 includes three second connection segments 222 arranged at intervals.

As shown in FIG. 32, embodiments of the present disclosure provide a connection structure 200 in the plasma processing apparatus. The first contour 213 and the second contour 223 are coaxial. By designing the first contour 213 and the second contour 223 to be coaxial, the connection structure 200 may uniformly feed energy into the coil structure 10 to further improve the uniformity of the coil magnetic field generated by the coupling of the coil structure 10. Correspondingly, the uniformity of the plasma generated in the reaction chamber 300 may be higher to improve processing uniformity of the plasma to the product.

In the connection structure 200 in the plasma processing apparatus of embodiments of the present disclosure, the two ends of the first connection segment 212 are electrically connected to an input end, respectively. The two ends of the second connection segment 222 are respectively electrically connected to an output end. The intervals between any two neighboring first connection segments 212 of the plurality of connection segments 212 may be equal. The intervals between any two neighboring second connection segments 222 of the plurality of second connection segments 222 may be equal. When the first connection segments 212 and the second connection segments 222 are evenly arranged along the first contour 213 and the second contour 223 at intervals, respectively, the uniformity of the RF energy fed into the coil structure 10 along the circumferential direction may be correspondingly improved. Thus, the uniformity of the magnetic field generated by the coil structure 10 may be improved. Therefore, the uniformity of the plasma in the reaction chamber 300 may be improved, and correspondingly the uniformity of the product processing by the plasma may be improved. Preferably, an arc length of the first connection segment 212 may be equal to a length of the interval between two neighboring first connection segments 212. An arc length of the second connection segment 222 may be equal to the distance between the two neighboring second connection segments 222. The RF energy feeding and the output positions may be arranged evenly to further improve the uniformity of the arrangement of the plasma and improve the uniformity of the product processing by the plasma.

Figure 35:
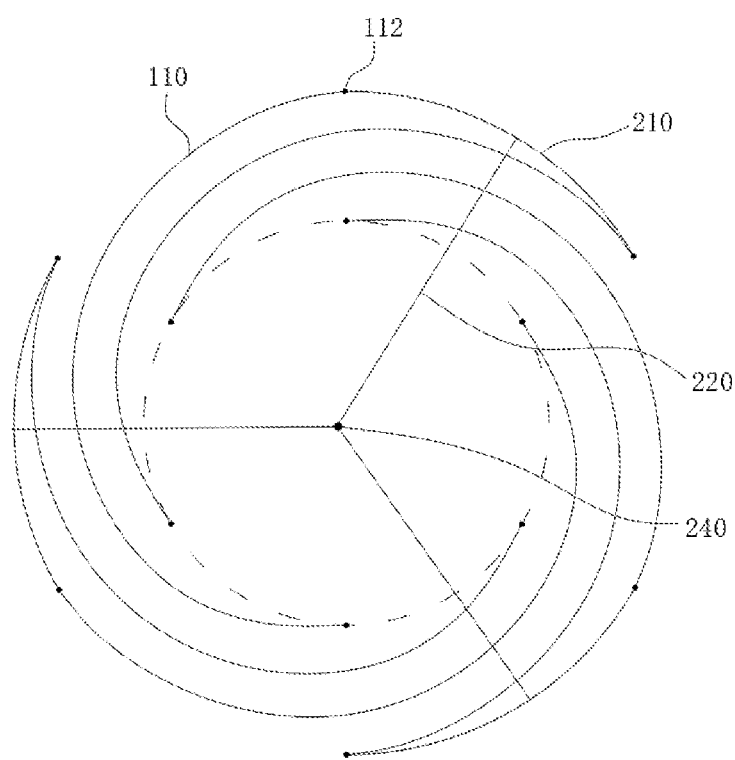
FIG. 35 is a schematic diagram showing connection between an upper layer coil in FIG. 17 and the first connector in FIG. 34.

As shown in FIG. 35, the first connector 210 includes three first connection segments 212. Second ends 112 of each two first coils are correspondingly connected to two ends of the first connection segment 212.

As shown in FIG. 32, in the plasma processing apparatus of embodiments of the present disclosure, the connection structure 200 further includes at least two first connection bars 250. A number of the first connection bars 250 may be the same as the number of the first connection segments 212. The first end of the first connection bar 250 is correspondingly connected to one first connection segment 212. The second end of the first connection bar 250 is configured to be electrically connected to the RF source 700 to input RF power. The connection structure 200 may further include at least two second connection bars 260. The number of the second connection bars 260 may be the same as the number of the second connection segments 222. The first end of the second connection bar 260 may be correspondingly connected to one second connection 222. The second end of the second connection bar 260 may be configured to be electrically connected to ground. Here, a specific form of electrical connection between the first connection segment 212 and the RF source 700 and between the second connection segment 222 and the ground is described. The first connection bar 250 is connected between the RF source 700 and the first connection segment 212. Based on realizing the electrical connection between the first connection segment 212 and the RF source 700, the first connection segment 212 may be ensured to be arranged along the circumferential direction of the first contour 213. The effect on the position arrangement by the electrical connection between the second connection segment 222 and the RF source 700 may be reduced. Similarly, the second connection bar 260 may be connected between the ground and the second connection segment 222. Based on realizing the electrical connection between the second connection segment 222 and the ground, the second connection segment 222 may be ensured to be arranged along the circumferential direction of the second contour 223. The effect on the position arrangement by the electric connection between the second connection segment 222 and the ground is reduced.

In a connection structure 200 of the plasma processing apparatus of embodiments of the present disclosure, as shown in FIG. 32 and FIG. 34, second ends of the at least two first connection bars 250 are both connected to a first point. The first point may be used as the power input end 270 and be configured to be electrically connected to the RF source 700. The RF 700 may be electrically connected to a single power input end 270. That is, the RF source 700 may be electrically connected to the plurality of first connection segments 212. The connection structure may be simple, and little interference may exist between different first connection bars 250. Similarly, the second ends of the at least two second bars 260 may be connected to the second point. The second point may be used as a ground end 280 and configured to be electrically connected to the ground. The ground may be electrically connected to a single ground end 280. That is, the ground may be electrically connected to the plurality of second connection segments 222. The connection structure may be simple. Little interference may exist between different second connection bars 260. Of course, the ground end 280 may be electrically connected to the ground through the capacitor and/or inductor.

Embodiments of the present disclosure provide a connection structure 200 in a plasma processing apparatus. As shown in FIG. 32 and FIG. 34, two ends of the first connection segment 212 are electrically connected to an input end respectively. A connection position of the corresponding first connection bar 250 and the first connection segment 212 may be located at a middle position in a length direction of the first connection segment 212. Two ends of the second connection segment 222 may be electrically connected to the output end. A connection position of the corresponding second connection bar 260 and the second connection segment 222 may be located at the middle position along the length direction of the second connection segment 222. The RF source 700 may provide RF energy to two coil sets at two ends of the first connection segment 212 through the first connection bar 250. Distances between the first connection bar 250 and the two ends of the first connection segment 212 may be same, and the distances between the second connection bar 260 and the two ends of the first connection segment 212 may also be same. Thus, effective lengths of the coils in the coil sets connected to the first connection segment 212 and the second connection segment 222 may be ensured to be the same to cause the coils to have the same inductance and the current value. Correspondingly, the uniformity of the magnetic field generated by the coils structure 10 may be improved. Thus, the uniformity of the coil magnetic field generated by coupling of the coil structure 10 is improved to improve the uniformity of the plasma in the reaction chamber.

Figure 27:
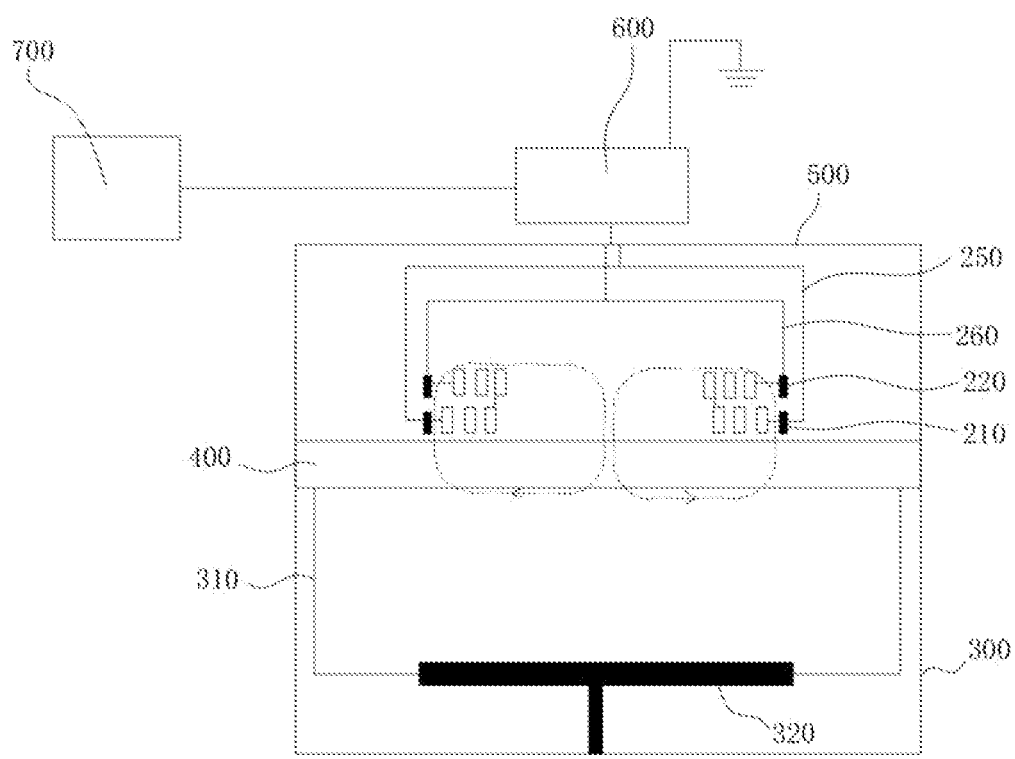
FIG. 27 is a schematic diagram of magnetic field distribution of a coil of the plasma processing apparatus in FIG. 19 with a first connector and a second connector of the connection structure being closed rings.
Figure 28:
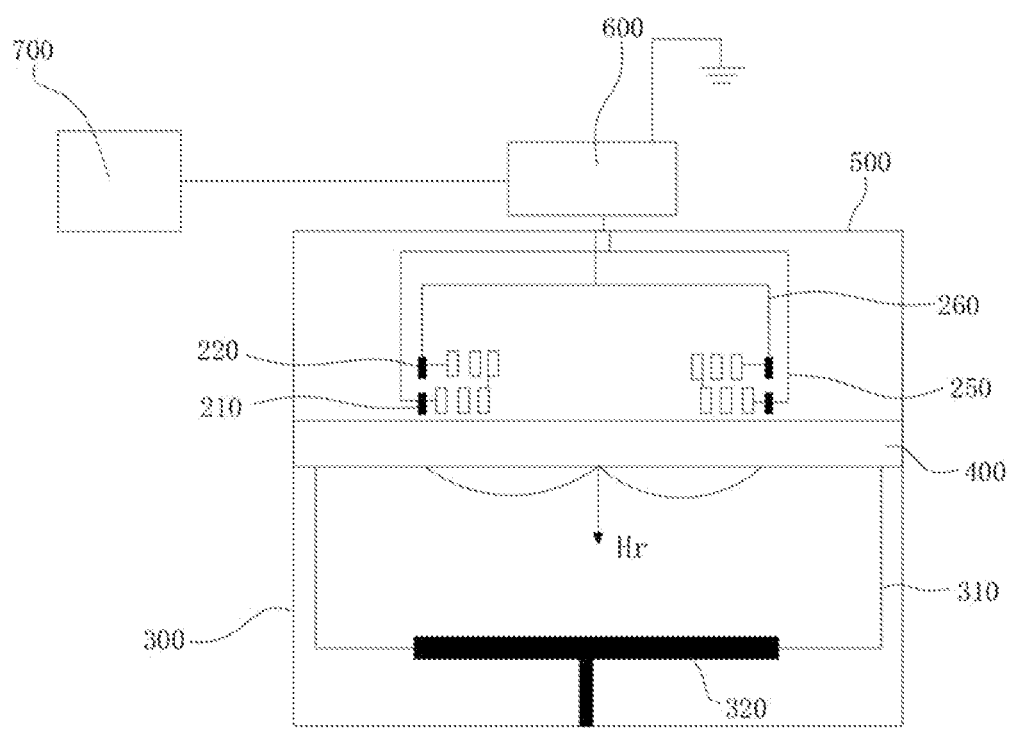
FIG. 28 is a schematic diagram of a magnetic amplitude value distribution in the plasma processing apparatus in FIG. 27.

With reference to FIG. 27 and FIG. 28, the plasma processing apparatus includes the coil structure 10. The connectors of the connection structure 200 are all closed rings as shown in FIG. 26. During the processing process, the closed rings may be used as the connection structure, which may generate a reverse current through induction in the coil magnetic field. The reverse inductance magnetic field generated by the reverse current may cancel or weaken the coil magnetic field. Thus, the magnetic field amplitude value Hr may be reduced. Correspondingly, the density of the plasma in the reaction chamber may be reduced. In addition, the reverse current generated by the first connector 210 and the second connector 220 of the connection structure 200 and the reverse induced magnetic field may block the coil magnetic field along the circumferential direction. The coil magnetic field may be distributed in the inner ring area. The magnetic field may not be distributed at an outer ring area of the connection structure 200. Correspondingly, the density of the plasma at the inner ring area of the connection structure 200 in the reaction chamber 300 may be relatively large. The density of the plasma at the outer ring area of the connection structure 200 in the reaction chamber 300 may be relatively small. Thus, the density of the plasma in the reaction chamber 300 may be small, and the distribution uniformity may be relatively poor. Thus, the product processing productivity and the uniformity may be poor.

Figure 36:
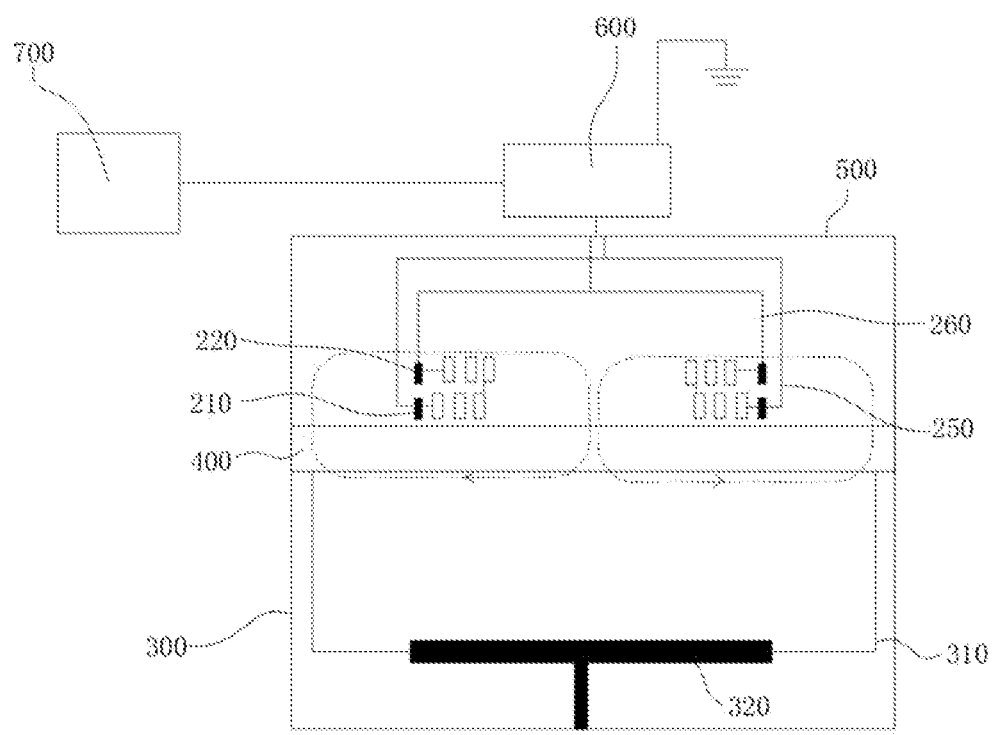
FIG. 36 is a schematic diagram showing coil magnetic field distribution of the plasma processing apparatus in FIG. 19 when the first connector and the second connector of the connection structure are connection segments.
Figure 37:
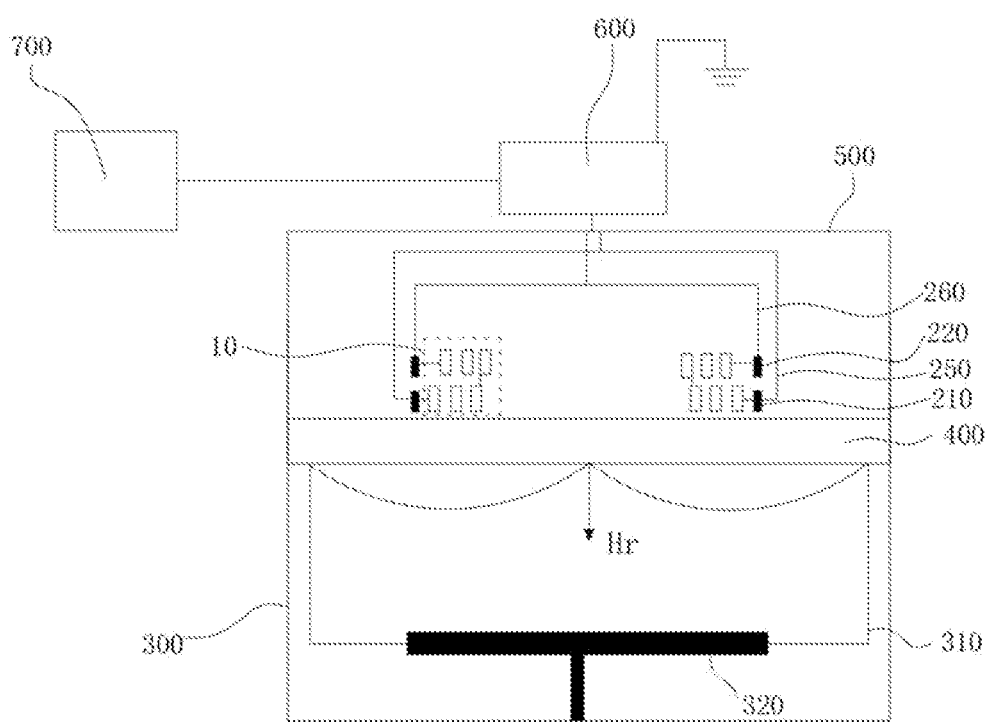
FIG. 37 is a schematic diagram showing the magnetic field amplitude value distribution in the plasma processing apparatus in FIG. 36.
Figure 38:
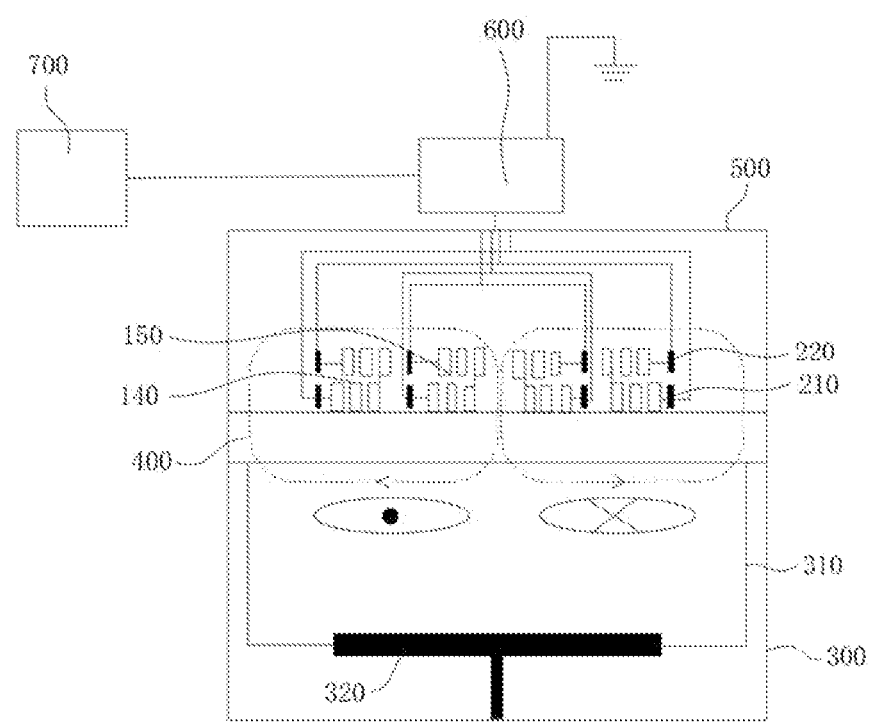
FIG. 38 is a schematic diagram showing coil magnetic field distribution of the plasma processing apparatus in FIG. 20 when the first connector and the second connector of the connection structure are connection segments.
Figure 39:
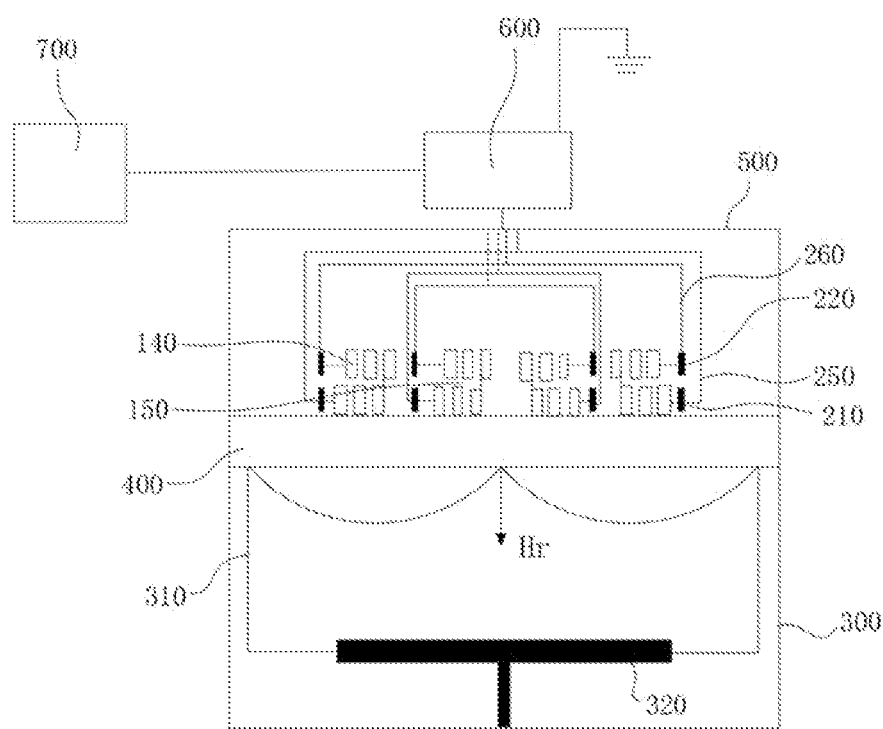
FIG. 39 is a schematic diagram showing the magnetic field amplitude value distribution of the plasma processing apparatus in FIG. 38.

With reference to FIG. 36 and FIG. 37, the difference between the plasma processing apparatus and the plasma processing apparatus in FIG. 27 and FIG. 28 includes that the first connector 210 of the connection structure 200 adopts the first connection segment 212 with a form that two ends are disconnected. The second connector 210 may also adopt the second connection segment 222 with a form that two ends are disconnected. During the processing process the first connector 210 and the second connector 220 may not generate the reverse current. Thus, the magnetic field amplitude value Hr may not be reduced, and the coil magnetic field may not be blocked. The magnetic field amplitude value Hr of the coil magnetic field generated in the reaction chamber 300 may be relatively large. The radial boundary of the coil magnetic field may be the chamber edge 330 of the reaction chamber 300. Thus, the magnetic field amplitude value of the inner coil magnetic field in the reaction chamber 300 and the magnetic field radial continuous distribution range may be improved. Correspondingly, the reaction chamber may be filled with the plasma. The plasma may have a large density. Thus, the productivity and uniformity of the product processing using the plasma may be improved.

Figure 29:
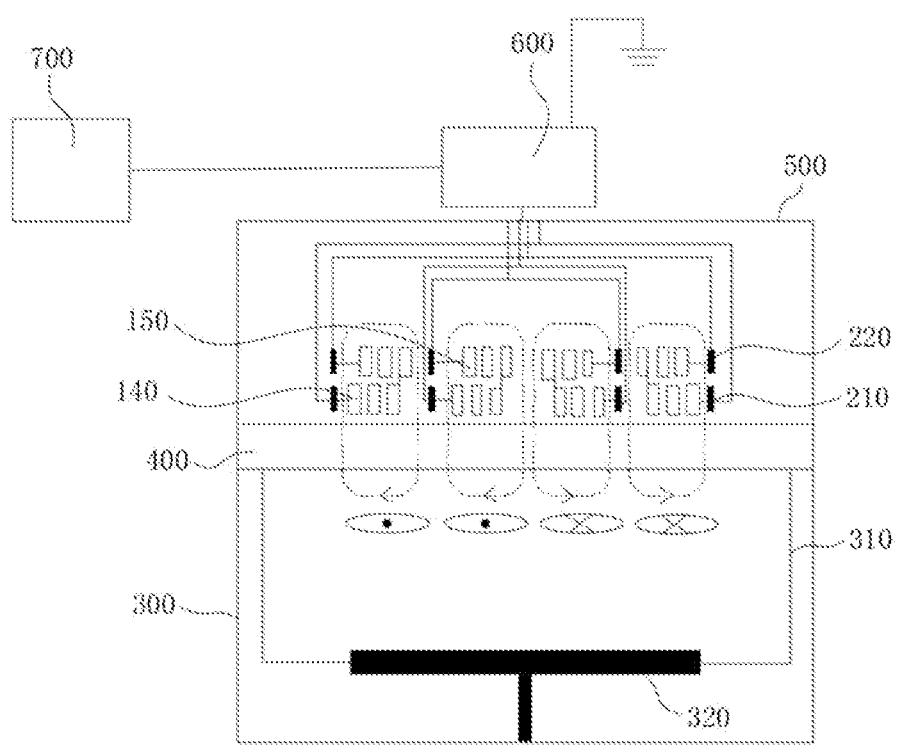
FIG. 29 is a schematic diagram of magnetic field distribution of the plasma processing apparatus in FIG. 20 with a first connector and a second connector of the two connection structures being closed rings.
Figure 30:
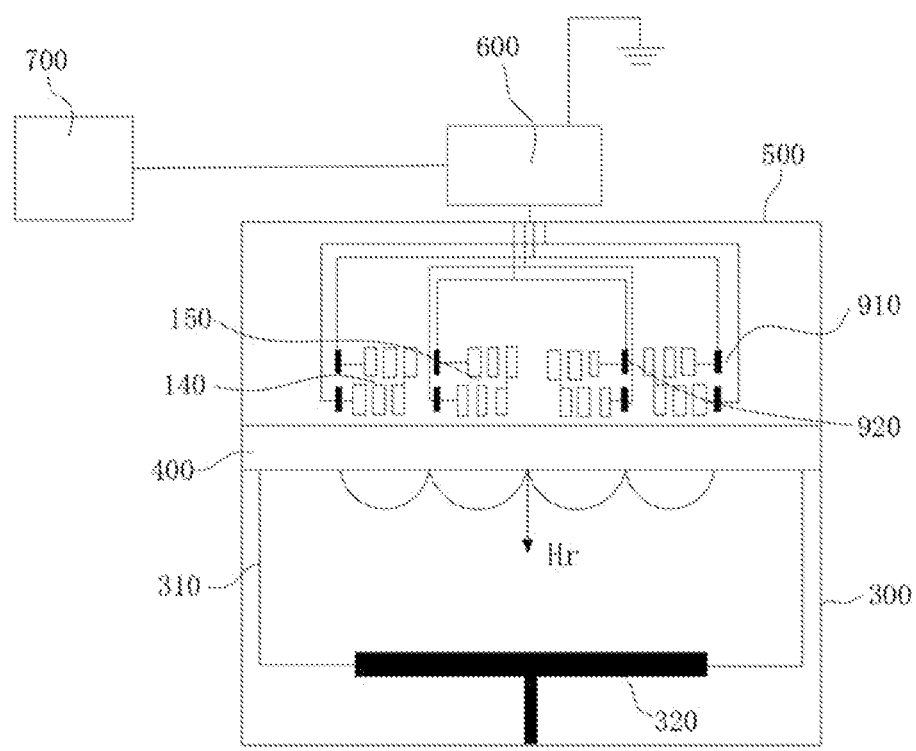
FIG. 30 is a schematic diagram showing magnetic field amplitude value distribution in the plasma processing apparatus in FIG. 29.
Figure 31:
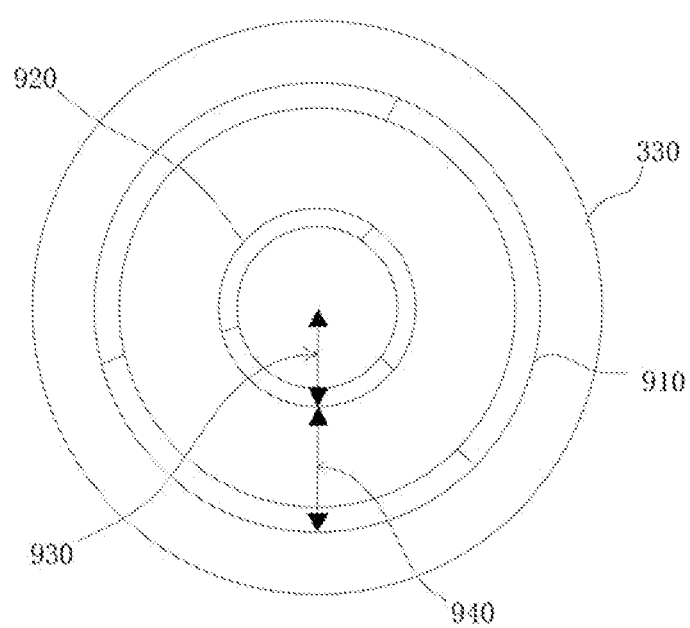
FIG. 31 is a schematic top view showing the coil magnetic field distribution in FIG. 29.

With reference to FIG. 29 and FIG. 30, two coil structures 10 and two connection structures 200 are arranged in the plasma processing apparatus. The first connector 210 and the second connector 220 of the two connection structures 200 are closed rings. The two coil structures 10 may be set to be the inner coil set 150 and the outer coil set 140 respectively. The connection structure 200 connected to the inner coil set 150 is an inner ring set 920. The connection structure 200 connected to the outer coil set 140 is an outer ring set 910. The inner coil set 150 is located at the inner ring of the outer coil set 140. During the processing process, the inner coil set 150 and the outer coil set 140 may be coupled to form a coupling induced magnetic film. As shown in FIG. 31, since the closed ring of the inner ring set 920 and the closed ring of the outer ring set 910 may generate the reverse current, the magnetic field amplitude value Hr of the coupling induced magnetic field may be reduced. Moreover, the inner ring set 920 and the outer ring set 910 may both block the coupling induced magnetic field. The inner ring set 920 and the outer ring set 910 may block the coupling induced magnetic field into an outer ring magnetic field 930 and an outer ring magnetic field 940. Moreover, the inner ring magnetic field 930 may be distributed at the inner ring area of the inner ring set 920. The outer ring magnetic field 940 may be distributed at the annular area enclosed by the inner ring set 920 and the outer ring set 910. The magnetic field may not be distributed at an area between the outer ring set 910 and the chamber boundary 330. Thus, the plasma in the reaction chamber 300 may correspond to the magnetic field and may be distributed at intervals at the outer ring set 910. The radial area may be located in the inner ring of the outer ring set 910. The density, uniformity, and radial distribution area may be relatively small. Thus, the productivity, uniformity, and processing range of the corresponding product may be poor.

Figure 40:
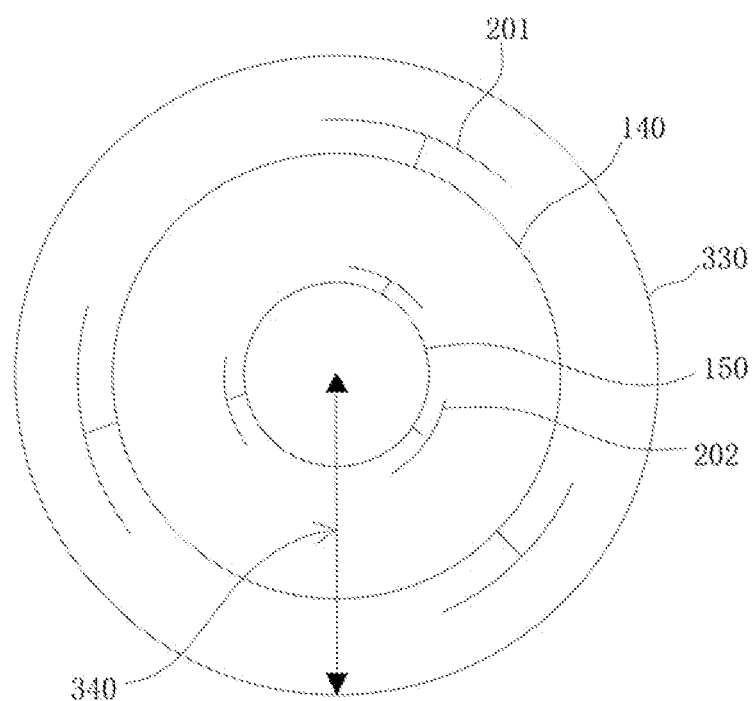
FIG. 40 is a schematic top view showing the coil magnetic field distribution in FIG. 38.

With reference to FIG. 32, FIG. 33, and FIG. 38 to FIG. 40, the difference between this plasma processing apparatus and the plasma processing apparatus of FIG. 29 and FIG. 30 includes that the first connectors 210 of the two connection structures 200 both adopt the first connection segment 212 in the form that the two ends are disconnected, the second connectors 220 of the two connection structures 200 adopt the second connection segment 222 in the form that the two ends are disconnected, the connection structure 200 connected to the outer coil set 140 is the outer connection structure 201, and the connection structure 200 connected to the inner coil set 150 is the inner connection structure 202. During the processing process, neither the inner connection structure 202 nor the outer connection structure 201 may generate the reverse current. Thus, the coupled induced magnetic field generated by the inner coil group 150 and the outer coil group 140 may not be weakened correspondingly, and the coupled induced magnetic field may not be blocked. The inner coil set 150 and the outer coil set 140 may generate a continuous magnetic field 340 with a relatively large magnetic field amplitude value Hr in the reaction chamber 300. As shown in FIG. 40, the radial boundary of the continuous magnetic field 340 is the chamber boundary 330 of the reaction chamber 300. The continuous magnetic field 340 is continuously distributed in the reaction chamber 300. Accordingly, the reaction chamber 300 is filled with plasma. The plasma may be arranged continuously and have a high density. Thus, the productivity and the uniformity of the product may be relatively high and the processing range may be relatively large.

Specifically, a dielectric member 400 in the plasma processing apparatus of embodiments of the present disclosure may include a dielectric barrel or a dielectric window.

In addition, a support base 320 and a liner 310 arranged around the support base 320 may be arranged in the reaction chamber 300. The support base 320 may be configured to carry the to-be-processed workpiece (e.g., a wafer). The liner 310 may be configured to protect an inner wall of the reaction chamber 300. The dielectric member 40 may be arranged on a top of the reaction chamber 300. The plasma processing apparatus may also include an adjustment bracket configured to adjust a height of the dielectric member 400, more precisely, adjust the height of the dielectric member 400 relative to the to-be-processed workpiece.

The plasma processing apparatus may further include a shield cover 500 and a matching device 600. The shield cover 500 may be arranged above the dielectric member 400. The coil structure 10 and the connection structure 200 may be both arranged in the shield cover 500. The RF source 700 may be connected to the connector of the connection structure 10, which is configured to input RF power through the matching device 600.

With the connection form among the first connector 210, the second connector 220, the third connector 230, the fourth connector 240, and the connection bars, the power of the coil set in the coil structure 10 may be distributed uniformly to further realize the uniformly distributed electromagnetic field generated by the coil structure 10 of the present disclosure, which is beneficial to generate the uniform plasma in the reaction chamber 300 to ensure etching.

It should be noted that, in the ground electrical connection of the present disclosure, the second connector 220 may be configured to be electrically connected to the coil set 100 and the ground. The connection manner between the second connector 220 and the ground is not limited by the present disclosure. In FIG. 19 to FIG. 21, FIG. 27 to FIG. 30, and FIG. 36 to FIG. 39 of embodiments of the present disclosure, the second connector 220 being electrically connected to the ground via the ground electrical connection end on the matching device 600 includes that the second connector 220 is grounded through a housing of the matching device, which is merely exemplarily described here. The connector of the connection structure 10 configured to be grounded may also be grounded through any manner such as the shield cover 500 or the outer wall of the reaction chamber, as long as the connector is grounded.

Although the present disclosure is disclosed above, the present disclosure is not limited to this. Those skilled in the art may make various changes and modifications without departing from the spirit and scope of the present disclosure. Therefore, the protection scope of the present disclosure should be based on the scope defined by the claims.

Finally, it should also be noted that in the present specification, relational terms such as first and second are used only to distinguish one entity or operation from another, and do not necessarily require or imply that there is any such actual relationship or sequence between these entities or operations. Moreover, the terms "comprising," "including," or any other variation thereof are intended to encompass non-exclusive inclusion such that a process, method, article, or apparatus comprising a list of elements includes not only those elements, but also includes other elements that are not explicitly listed or elements inherent to such a process, method, article, or apparatus. Without further limitation, an element associated with the phrase "comprising a . . . " does not preclude the presence of additional identical elements in a process, method, article, or apparatus that includes the element.

The above description of the disclosed embodiments enables those skilled in the art to make or use the present disclosure. Various modifications to these embodiments will be apparent to those skilled in the art, and the generic principles defined herein may be implemented in other embodiments without departing from the spirit or scope of the present disclosure. Thus, the present disclosure is not intended to be limited to the embodiments shown herein, but conforms to the widest scope consistent with the principles and novel features disclosed in the present application.

What is claimed is:

1. A coil structure applied to a plasma processing apparatus comprising:
   at least two coil sets, each coil set of the at least two coil sets including:
   a first coil; and
   a second coil;
   wherein:
   the first coil and the second coil are wound to form an annular area;
   a first end of the first coil and a first end of the second coil are close to an inner ring of the annular area;
   a second end of the first coil and a second end of the second coil are close to an outer ring of the annular area;
   the first end of the first coil is electrically connected to the first end of the second coil;
   a first projection of the first coil on a plane perpendicular to an axial direction of the coil structure and a second projection of the second coil on the plane are mirror-symmetrical to each other;
   the first end of the first coil and the first end of the second coil are arranged at an interval along the axial direction of the coil structure;
   the second end of the first coil and the second end of the second coil are arranged at an interval along the axial direction of the coil structure;
   a connection line between the first end of the first coil and the first end of the second coil is parallel to an axis of the coil structure;
   a connection line between the second end of the first coil and the second end of the second coil is parallel to the axis of the coil structure;
   first ends of first coils of the at least two coil sets are on a first plane;
   first ends of second coils of the at least two coil sets are on a second plane;
   second ends of the first coils of the at least two coil sets are on a third plane;
   second ends of the second coils of the at least two coil sets are on a fourth plane; and
   the first plane is separated from the second plane by a predetermined distance, and the third plane is separated from the fourth plane by the predetermined distance.

2. The coil structure according to claim 1, wherein the predetermined distance is 10 mm.

3. The coil structure according to claim 1, wherein:
   the first ends of the first coils of the at least two coil sets are arranged uniformly along a circumferential direction of the coil structure; and
   the second ends of the first coils of the at least two coil sets are arranged uniformly along the circumferential direction of the coil structure.

4. The coil structure according to claim 1, wherein winding trajectories of the first coil and the second coil are both in an involute shape.

5. The coil structure according to claim 4, wherein at least one of a radial radius change amount of each turn of the first coil or a radial radius change amount of each turn of the second coil equals 60 mm.

6. The coil structure according to claim 1, wherein a number of winding turns of the first coil and a number of winding turns of the second coil are both integer multiples of 0.5 turns.

7. The coil structure according to claim 1, wherein the coil set is one of a plurality of coil sets of the coil structure, and a number of the plurality of coil sets is an even number.

8. The coil structure according to claim 1, wherein:
   the first end of the first coil on the first projection overlaps with the first end of the second coil on the second projection; and
   the second end of the second coil on the first projection overlaps with the second end of the second coil on the second projection.

9. A plasma processing apparatus comprising:
   a radio frequency (RF) source;
   a reaction chamber;
   a dielectric member arranged on a top of the reaction chamber; and
   a coil structure arranged on the dielectric member and including:

at least two coil sets, each coil set of the at least two coil
sets including:
a first coil; and
a second coil;
wherein:
the first coil and the second coil are wound to form
an annular area;
a first end of the first coil and a first end of the second
coil are close to an inner ring of the annular area;
a second end of the first coil and a second end of the
second coil are close to an outer ring of the annular
area;
the first end of the first coil is electrically connected
to the first end of the second coil;
a first projection of the first coil on a plane perpendicular to an axial direction of the coil structure
and a second projection of the second coil on the
plane are mirror-symmetrical to each other;
the first end of the first coil and the first end of the
second coil are arranged at an interval along the
axial direction of the coil structure;
the second end of the first coil and the second end of
the second coil are arranged at an interval along
the axial direction of the coil structure;
a connection line between the first end of the first coil
and the first end of the second coil is parallel to an
axis of the coil structure;
a connection line between the second end of the first
coil and the second end of the second coil is
parallel to the axis of the coil structure;
first ends of first coils of the at least two coil sets are
on a first plane;
first ends of second coils of the at least two coil sets
are on a second plane;
second ends of the first coils of the at least two coil
sets are on a third plane;
second ends of the second coils of the at least two
coil sets are on a fourth plane; and
the first plane is separated from the second plane by
a predetermined distance, and the third plane is
separated from the fourth plane by the predetermined distance.

10. The plasma processing apparatus according to claim 9, further comprising:
a connection structure including:
a first connector electrically connected to the second
end of the first coil; and
a second connector electrically connected to the second
end of the second coil;
wherein one of the first connector and the second connector is configured to input RF power, and another one
of the first connector and the second connector is
configured to be grounded.

11. The plasma processing apparatus according to claim 10, wherein:
the first connector and the second connector both have an
annular structure; and
the first connector and the second connector are arranged
at an interval along the axial direction of the coil
structure.

12. The plasma processing apparatus according to claim 10, wherein:
the connection structure further includes:
a third connector electrically connected to the first
connector through a first connection bar; and
a fourth connector electrically connected to the second
connector through a second connection bar; and one of the third connector and the fourth connector is
configured to input RF power, and another one of the
third connector and the fourth connector is configured
to be grounded.

13. The plasma processing apparatus according to claim 12, wherein the third connector and the fourth connector
both have an annular structure and are arranged at an interval
along the axial direction of the coil structure.

14. The plasma processing apparatus according to claim 12, wherein:
the first connection bar is one of a plurality of first
connection bars uniformly arranged along a circumferential direction of the coil structure; and
the second connection bar is one of a plurality of second
connection bars uniformly arranged along the circumferential direction of the coil structure.

15. The plasma processing apparatus according to claim 10, wherein:
the second end of the first coil of the coil set is configured
as an input end, and the second end of the second coil
of the coil set is configured as an output end; and
the first connector includes a first connection segment
connected to the input end, and a number of the first
connection segment connected to the input end is at
least one, and/or the second connector includes a second connection segment connected to the output end, a
number of the second connection segment connected to
the output end is at least one.

16. The plasma processing apparatus according to claim 15, comprising a plurality of coil sets wherein:
the first connection segment is one of at least two first
connection segments of the first connector that are
arranged at an interval along a circumferential direction
to enclose to from a first contour; and
a number of the coil sets is twice a number of the first
connection segments;
a number of input ends connected to each of the first
connection segments is two;
the second connection segment is one of at least two
second connection segments of the second connector
that are arranged at an interval along the circumferential direction to enclose to form a second contour;
the number of the coil sets is twice a number of the second
connection segment; and
a number of output ends connected to each of the second
connection segments is two.

17. The plasma processing apparatus according to claim 16, wherein the first contour is annular, the second contour
is annular, and the first contour and the second contour are
coaxial.

18. The plasma processing apparatus according to claim 16, wherein:
an interval between any two neighboring ones of the at
least two first connection segments is same; and/or
an interval between any two neighboring ones of the at
least two second connection segments is same.

19. The plasma processing apparatus according to claim 16, wherein the connection structure further includes:
at least two first connection bars, a number of the first
connection bars being same as the number of the first
connection segments, a first end of each of the first
connection bars being connected to a corresponding
one of the first connection segments, and a second end
of each of the first connection bars being configured to
input RF power; and/or
at least two second connection bars, a number of the
second connection bars being same as the number of the second connection segments, a first end of each of the second connection bars being connected to a corresponding one of the second connection segments, and a second end of each of the second connection bars being configured to be grounded.

* * * * *